US011615223B2

(12) United States Patent
Taralova

(10) Patent No.: US 11,615,223 B2
(45) Date of Patent: *Mar. 28, 2023

(54) TUNING SIMULATED DATA FOR OPTIMIZED NEURAL NETWORK ACTIVATION

(71) Applicant: Zoox, Inc., Foster City, CA (US)

(72) Inventor: Ekaterina Hristova Taralova, Redwood City, CA (US)

(73) Assignee: Zoox, Inc., Foster City, CA (US)

( * ) Notice: Subject to any disclaimer, the term of this patent is extended or adjusted under 35 U.S.C. 154(b) by 343 days.

This patent is subject to a terminal disclaimer.

(21) Appl. No.: 17/071,955

(22) Filed: Oct. 15, 2020

(65) Prior Publication Data

US 2021/0027111 A1    Jan. 28, 2021

Related U.S. Application Data

(63) Continuation of application No. 16/163,435, filed on Oct. 17, 2018, now Pat. No. 10,832,093.
(Continued)

(51) Int. Cl.
*G06F 30/20* (2020.01)
*G05D 1/00* (2006.01)
(Continued)

(52) U.S. Cl.
CPC ........... *G06F 30/20* (2020.01); *G05D 1/0088* (2013.01); *G06K 9/6215* (2013.01);
(Continued)

(58) Field of Classification Search
CPC .... G06F 30/20; G05D 1/0088; G06K 9/6215; G06K 9/6262; G06K 9/6269; G06N 3/04;
(Continued)

(56) References Cited

U.S. PATENT DOCUMENTS 6,587,787 B1    7/2003 Yokota
9,135,559 B1 *  9/2015 Chan ...................... G06N 5/022
(Continued)

FOREIGN PATENT DOCUMENTS

CA    2337609 C  *  1/2007    .............. B60L 1/003
CA    2629653 A1    11/2009
(Continued)

OTHER PUBLICATIONS

Jeong, et al., "Adaptive Inverse Perspective Mapping for Lane Map Generation with SLAM", 2016 13th International Conference on Ubiquitous Robots and Ambient Intelligence ( URAI), 2016, pp. 38-41.
(Continued)

*Primary Examiner* — Mahendra R Patel
(74) *Attorney, Agent, or Firm* — Lee & Hayes, P.C.

(57) ABSTRACT

Techniques described herein are directed to comparing, using a machine-trained model, neural network activations associated with data representing a simulated environment and activations associated with data representing real environment to determine whether the simulated environment is causes similar responses by the neural network, e.g., a detector. If the simulated environment and the real environment do not activate the same way (e.g., the variation between neural network activations of real and simulated data meets or exceeds a threshold), techniques described herein are directed to modifying parameters of the simulated environment to generate a modified simulated environment that more closely resembles the real environment.

20 Claims, 8 Drawing Sheets

Related U.S. Application Data

(60) Provisional application No. 62/716,839, filed on Aug. 9, 2018.

(51) Int. Cl.

| | | |
|---|---|---|
| *G06T 15/04* | (2011.01) | |
| *G06T 17/05* | (2011.01) | |
| *G06T 17/20* | (2006.01) | |
| *G06T 19/20* | (2011.01) | |
| *G06K 9/62* | (2022.01) | |
| *G06N 3/04* | (2023.01) | |
| *G06N 3/08* | (2023.01) | |
| *G06V 10/75* | (2022.01) | |
| *G01S 13/89* | (2006.01) | |
| *G01S 15/89* | (2006.01) | |
| *G01S 17/89* | (2020.01) | |

(52) U.S. Cl.
CPC ......... *G06K 9/6262* (2013.01); *G06K 9/6269* (2013.01); *G06N 3/04* (2013.01); *G06N 3/08* (2013.01); *G06T 15/04* (2013.01); *G06T 17/05* (2013.01); *G06T 17/20* (2013.01); *G06T 19/20* (2013.01); *G06V 10/758* (2022.01); *G01S 13/89* (2013.01); *G01S 15/89* (2013.01); *G01S 17/89* (2013.01); *G06T 2215/16* (2013.01); *G06T 2219/2004* (2013.01)

(58) Field of Classification Search
CPC ........... G06N 3/08; G06T 15/04; G06T 17/05; G06T 17/20; G06T 19/20; G06T 2215/16; G06T 2219/2004; G06V 10/758; G01S 13/89; G01S 15/89; G01S 17/89; G01S 13/862; G01S 13/865; G01S 13/867; G01S 15/931; G01S 17/931; G01S 2013/9318; G01S 2013/9322
USPC ....................................................... 382/104
See application file for complete search history.

(56) References Cited

U.S. PATENT DOCUMENTS

| | | |
|---|---|---|
| 9,171,464 B2 | 10/2015 | Khetan et al. |
| 9,612,123 B1 | 4/2017 | Levinson et al. |
| 9,632,502 B1 | 4/2017 | Levinson et al. |
| 9,878,155 B1 | 1/2018 | Phillips et al. |
| 10,026,222 B1 | 7/2018 | Morrison et al. |
| 10,140,515 B1 | 11/2018 | Waldo |
| 10,254,760 B1 | 4/2019 | Abeloe |
| 10,268,191 B1 | 4/2019 | Lockwood et al. |
| 10,545,229 B2 | 1/2020 | Rohani et al. |
| 10,642,275 B2 | 5/2020 | Silva et al. |
| 10,802,485 B2 | 10/2020 | Walker et al. |
| 10,831,202 B1 | 11/2020 | Askeland et al. |
| 2003/0014378 A1 | 1/2003 | Goodnight et al. |
| 2003/0018277 A1 | 1/2003 | He |
| 2007/0192076 A1* | 8/2007 | Boutin ................ G06F 30/20 703/13 |
| 2007/0288410 A1* | 12/2007 | Tomkins ................ G06N 3/086 706/42 |
| 2008/0033645 A1 | 2/2008 | Levinson et al. |
| 2010/0312736 A1* | 12/2010 | Kello ................ G06N 3/063 706/26 |
| 2011/0187719 A1 | 8/2011 | Usui et al. |
| 2012/0115505 A1 | 5/2012 | Miyake et al. |
| 2012/0203458 A1 | 8/2012 | Fujimoto |
| 2013/0127852 A1 | 5/2013 | Menkov |
| 2013/0162665 A1 | 6/2013 | Lynch |
| 2013/0179047 A1 | 7/2013 | Miller et al. |
| 2014/0185880 A1 | 7/2014 | Fairfield et al. |
| 2014/0214255 A1 | 7/2014 | Dolgov et al. |
| 2014/0225771 A1 | 8/2014 | Phuyal et al. |
| 2014/0309833 A1 | 10/2014 | Ferguson et al. |
| 2015/0057871 A1 | 2/2015 | Ono et al. |
| 2015/0248131 A1 | 9/2015 | Fairfield et al. |
| 2015/0254986 A1 | 9/2015 | Fairfield et al. |
| 2015/0262399 A1 | 9/2015 | Popescu |
| 2015/0336502 A1 | 11/2015 | Hillis et al. |
| 2015/0346722 A1 | 12/2015 | Herz et al. |
| 2015/0379394 A1* | 12/2015 | Thaler ................. G06N 3/0454 706/22 |
| 2016/0055276 A1* | 2/2016 | Kim ....................... G06F 30/20 703/2 |
| 2016/0071278 A1 | 3/2016 | Leonard et al. |
| 2016/0189544 A1 | 6/2016 | Ricci |
| 2016/0275397 A1* | 9/2016 | Neil ...................... G06N 3/049 |
| 2016/0378894 A1* | 12/2016 | Yoon ................. G06Q 30/0202 703/18 |
| 2017/0068861 A1 | 3/2017 | Miller et al. |
| 2017/0139411 A1* | 5/2017 | Hartung ................. H04L 12/40 |
| 2017/0193368 A1 | 7/2017 | Le Grand et al. |
| 2017/0316333 A1* | 11/2017 | Levinson ........ B60W 60/00274 |
| 2017/0329332 A1 | 11/2017 | Pilarski et al. |
| 2017/0372431 A1 | 12/2017 | Perl et al. |
| 2017/0372612 A1 | 12/2017 | Bai et al. |
| 2018/0136662 A1 | 5/2018 | Kim |
| 2018/0151077 A1 | 5/2018 | Lee |
| 2018/0232639 A1 | 8/2018 | Lin et al. |
| 2018/0247193 A1* | 8/2018 | Holtham .............. G06N 3/0454 |
| 2018/0349214 A1* | 12/2018 | Johnson ................. G06F 9/546 |
| 2019/0035098 A1 | 1/2019 | Pinard |
| 2019/0204832 A1 | 7/2019 | Abeloe |
| 2019/0235521 A1 | 8/2019 | Mudalige et al. |
| 2019/0238568 A1 | 8/2019 | Goswami et al. |
| 2019/0279094 A1* | 9/2019 | Baughman ............. G06N 3/082 |
| 2020/0027157 A1 | 1/2020 | Xu et al. |
| 2020/0042813 A1 | 2/2020 | Nagao et al. |
| 2020/0050716 A1 | 2/2020 | Dolan et al. |
| 2020/0051327 A1 | 2/2020 | Dolan et al. |
| 2020/0098135 A1 | 3/2020 | Ganjineh et al. |
| 2021/0365610 A1 | 11/2021 | Dolan et al. |

FOREIGN PATENT DOCUMENTS

| | | | | |
|---|---|---|---|---|
| CA | 2998274 A1 * | 9/2018 | .......... | G06F 11/3684 |
| CA | 3064771 A1 * | 12/2018 | .......... | G06F 11/3684 |
| CN | 107315571 A | 11/2017 | | |
| CN | 108932289 A | 12/2018 | | |
| GB | 2568087 A * | 5/2019 | .......... | G06N 3/0454 |
| WO | WO2017180364 | 10/2017 | | |
| WO | WO-2018140969 A1 * | 8/2018 | .............. | G06N 3/04 |
| WO | WO2019171291 A1 | 9/2019 | | |

OTHER PUBLICATIONS

Office Action for U.S. Appl. No. 16/163,466, dated Dec. 24, 2020, Dolan, "Procedural World Generation Using Tertiary Data", 16 Pages.
Non Final Office Action dated Jan. 28, 2020 for U.S. Appl. No. 16/163,478 "Procedural World Generation" Dolan, 20 pages.
The PCT Invitation to Pay Additional Fees, dated Nov. 6, 2019, for PCT Application No. PCT/US2019/045805, 12 pages.
The PCT Search Report, and Written Opinion dated Jan. 9, 2020, for PCT Application No. PCT/US2019/045805, 14 pages.
The PCT Search Report and Written Opinion dated Dec. 3, 2019 for PCT Application No. PCT/US2019/051761, 14 pages.
Roh, et. al., "Accurate Mobile Urban Mapping via Digital Map-Based SLAM", Sensors, Jan. 18, 2016, vol. 16, No. 8, 24 pages.

* cited by examiner

TUNING SIMULATED DATA FOR OPTIMIZED NEURAL NETWORK ACTIVATION

PRIORITY APPLICATION

This application is a continuation of and claims priority to U.S. patent application Ser. No. 16/163,435, filed on Oct. 17, 2018, titled "TUNING SIMULATED DATA FOR OPTIMIZED NEURAL NETWORK ACTIVATION," which claims priority to U.S. Provisional Patent Application No. 62/716,839, filed on Aug. 9, 2018, titled "Procedural World and Agent Generation," the entire contents of both which are herein incorporated by reference.

BACKGROUND

Simulated-world environments ("simulated environments") can be useful for enhancing training, testing, and/or validating systems (e.g., one or more components of an artificial intelligence (AI) stack) onboard an autonomous vehicle. For instance, in at least one example, simulated environments can be useful for training systems that are to be used onboard an autonomous vehicle (e.g., models used by such systems), for instance when real data is not readily available, when testing would be unsafe in a real-world environment ("real environment"), and in order to generate more data than would otherwise be available. In at least one example, simulated environments can be used for generating training data for rare or infrequently occurring scenarios and/or objects. Moreover, simulated environments can be useful for testing performance of an autonomous vehicle (e.g., models and/or systems running thereon), for instance when real environments are either not available or are not safe, or a ground truth is not otherwise available.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1A:
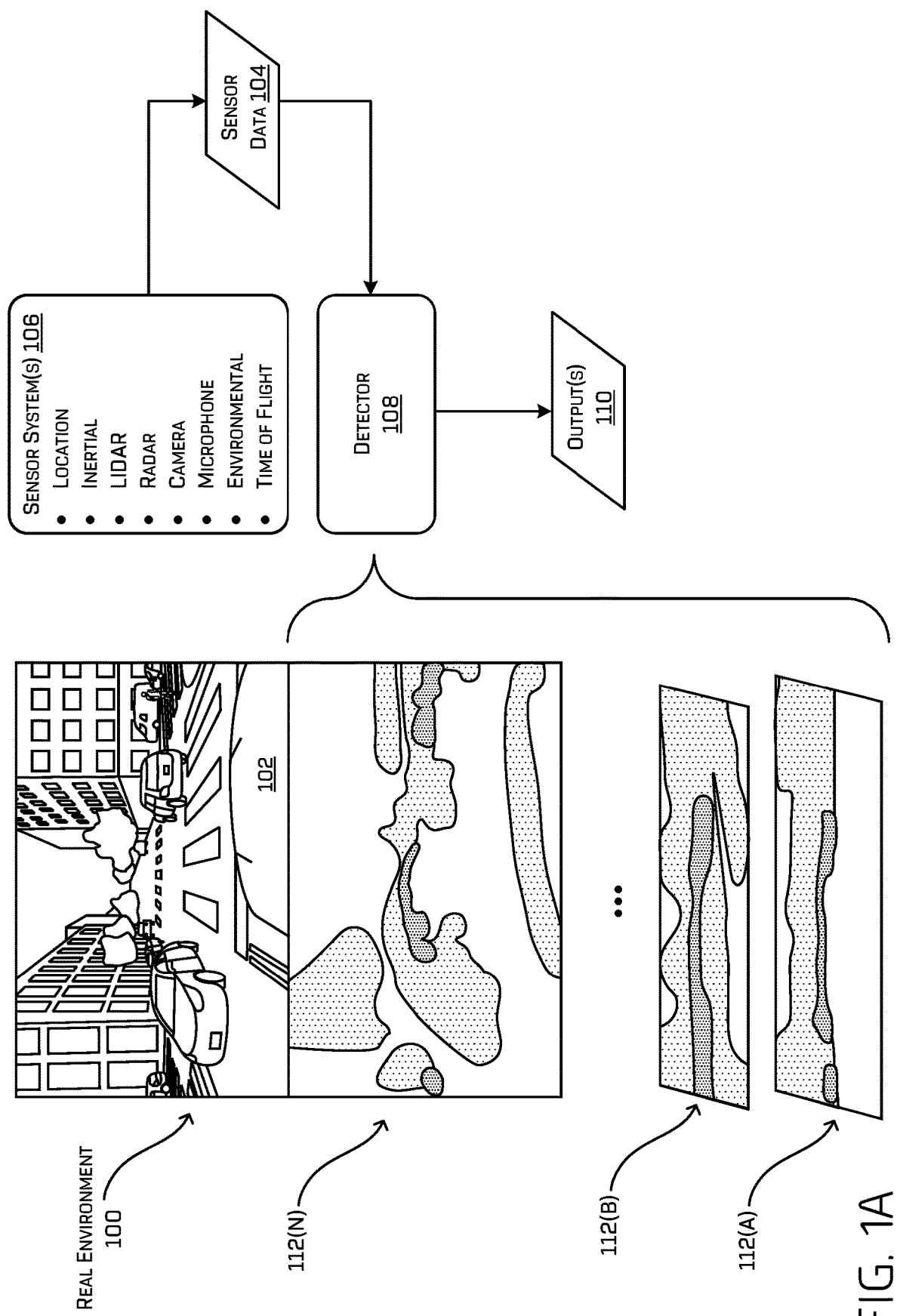
FIG. 1A is an example of a real-world environment ("real environment") as perceived by a vehicle, as described herein.

Techniques described herein are directed to various aspects of tuning simulated data for optimized neural network activation. That is, techniques described herein are directed to quantifying how realistic simulated-world environments (e.g., "simulated environments") need to be in order for such simulated environments to be used for enhancing training, testing, and/or validating systems (e.g., one or more components of an artificial intelligence (AI) stack) onboard an autonomous vehicle. In at least one example, such "realism" is evaluated based on comparing neural network activity (e.g., neural network activations generated by a neural network) associated with simulated environments. In some examples, techniques described herein are additionally directed to tuning parameters of simulated environments, thereby improving simulation. In an example, techniques described herein are directed to training a data model based on training data associated with real-world environments ("real environments"). The training data can include pairs of images and neural network activations ("activations") associated with each image of the pairs of images. The activations can be output from a detector such as a vision system, a light detection and ranging (LIDAR) sensor system (e.g., LIDAR system), etc. The individual images of the pairs of images can be compared to determine a difference between the individual images (e.g., a difference between the activations associated with each of the images). The training data can comprise a plurality of differences as determined from the images, which can be used for training the data model, for instance via a machine learning mechanism (e.g., support vector machine (SVM), etc.).

The accuracy of a simulated environment can be analyzed using the machine-trained data model by comparing intermediate outputs of a neural network (e.g., activations) in response to an image associated with a real environment and a corresponding image associated with a simulated environment. The images can correspond such that they represent the same portion of their respective environments. Activations associated with each of the images can be analyzed using the machine-trained data model and the machine-trained data model can output a difference indicating the variation between the two images. That is, the machine-trained data model can output an indication of how realistic the simulated environment is when compared to the corresponding real environment (or portion thereof). That is, the machine-trained data model can output an indication of how similar neural network activations associated with a simulated environment are to neural network activations associated with a corresponding real environment. If the difference meets or exceeds a threshold, techniques described herein are directed to adjusting one or more parameters associated with the simulated environment to modify the neural network activity associated with the simulated environment such that the neural network activity is more similar to neural network activity of a corresponding real world.

Techniques described herein enable simulation systems to conserve resources by generating less photorealistic simulated environments than are required with conventional techniques. Instead, techniques described herein enable simulation systems to direct resources to generating simulated environments that have features that activate a neural network in a way that is substantially similar to a real environment. So long as a simulated environment activates a neural network in a way that is substantially similar to a real environment, a simulation system need not expend additional resources in generating photorealistic simulated environments. This conversation of resources can thus reduce compute required to generate simulated environments, and also enables the generation of such environments faster that what is available with conventional techniques.

FIG. 1A is an example of a real environment 100 as perceived by such an autonomous vehicle 102. In an example, the autonomous vehicle 102 can traverse the real environment 100. In some examples, while traversing the real environment 100, the autonomous vehicle 102 can generate sensor data 104 that can be used to inform maps of the real environment 100 and/or inform movement of the autonomous vehicle 102 within the real environment 100. For instance, the autonomous vehicle 102 can be equipped with sensor systems 106 that generate sensor data 104 associated with the real environment 100. Such sensor systems 106 can include, but are not limited to, LIDAR sensors, radio detection and ranging (RADAR) sensors, ultrasonic transducers, sound navigation and ranging (SONAR) sensors, location sensors (e.g., global positioning system (GPS), compass, etc.), inertial sensors (e.g., inertial measurement units, accelerometers, magnetometers, gyroscopes, etc.), cameras (e.g., RGB, IR, intensity, depth, etc.), wheel encoders, microphones, environment sensors (e.g., temperature sensors, humidity sensors, light sensors, pressure sensors, etc.), Time of Flight (ToF) sensors, etc. In at least one example, an autonomous vehicle 102 can utilize one or more onboard systems to analyze the sensor data 104 to, among other things, map and make determinations about the real environment 100 within which it is positioned. For instance, the autonomous vehicle 102 can utilize a detector 108 to analyze the sensor data 104 to map and make determinations about the real environment 100 within which it is positioned. Such an autonomous vehicle 102 can utilize the map of the real environment 100 to determine trajectories for driving within the real environment 100. Furthermore, in additional or alternative examples, an autonomous vehicle 102 can utilize the sensor data 104 to detect objects in the real environment 100, segment the real environment 100, localize its position in the real environment 100, classify objects in the real environment 100, etc. Additional details are provided below with reference to FIG. 2.

The detector 108 can represent a system that analyzes the sensor data 104 and generates one or more outputs 110 based on the sensor data 104. In at least one example, the detector 108 can comprise a neural network for analyzing the sensor data 104. For instance, the detector 108 can comprise a vision system that can utilize one or more image processing algorithms to perform object detection, segmentation, and/or classification with respect to object(s) identified in an image. In some examples, the vision system can associate a bounding box (or otherwise an instance segmentation) with an identified object and can associate a confidence score associated with a classification of the identified object. In some examples, objects, when rendered via a display, can be colored, annotated, or otherwise identified based on their perceived class. In at least other examples, similar processes (e.g., detection, classification, segmentation, etc.) may be performed by the detector 108 for one or more other modalities (e.g., LIDAR, RADAR, ToF systems, etc.). For the purpose of this discussion, "image" can refer to any output whether the image is an image captured by a vision system or an aggregate presentation of data generated from another modality (e.g., LIDAR, RADAR, ToF systems, etc.).

In at least one example, the output(s) 110 can be based on one or more activation layers 112 generated by the neural network associated with the detector 108, which can be used by the detector 108 and/or other onboard system(s) to, among other things, map and make determinations concerning the real environment 100 within which the autonomous vehicle 102 is positioned. In FIG. 1A, three layers are illustrated (e.g., a first layer 112A, a second layer 112B, and an Nth layer 112N); however, any number of layers can be associated with a neural network, such as the detector 108. In at least one example, the activations can be analyzed by the detector 108 and/or other onboard system(s) (e.g., a perception system) to classify objects in the real environment 100.

In at least one example, intermediate output(s) 112 can be used as training data for training a data model (e.g., using a machine learning mechanism). In at least one example, the training data can comprise activations, which can be analyzed in pairs. Individual activations of the pairs of activations can be compared to determine a difference between the individual activations. The training data can thus comprise a plurality of differences as determined from pairs of activations, which can be used for training the data model, for instance via a machine learning mechanism (e.g., SVM, etc.). In at least one example, the pairs of activations can be associated with same subjects (or substantially similar), similar subjects, and different subjects. A subject, for the purpose of this discussion, can refer to an image (e.g., such as a captured image, an image of LIDAR data, etc.), a portion of an image, an object, a portion of an object, etc.

FIG. 1A is merely provided for illustrative purposes and should not be construed as limiting.

Figure 1B:
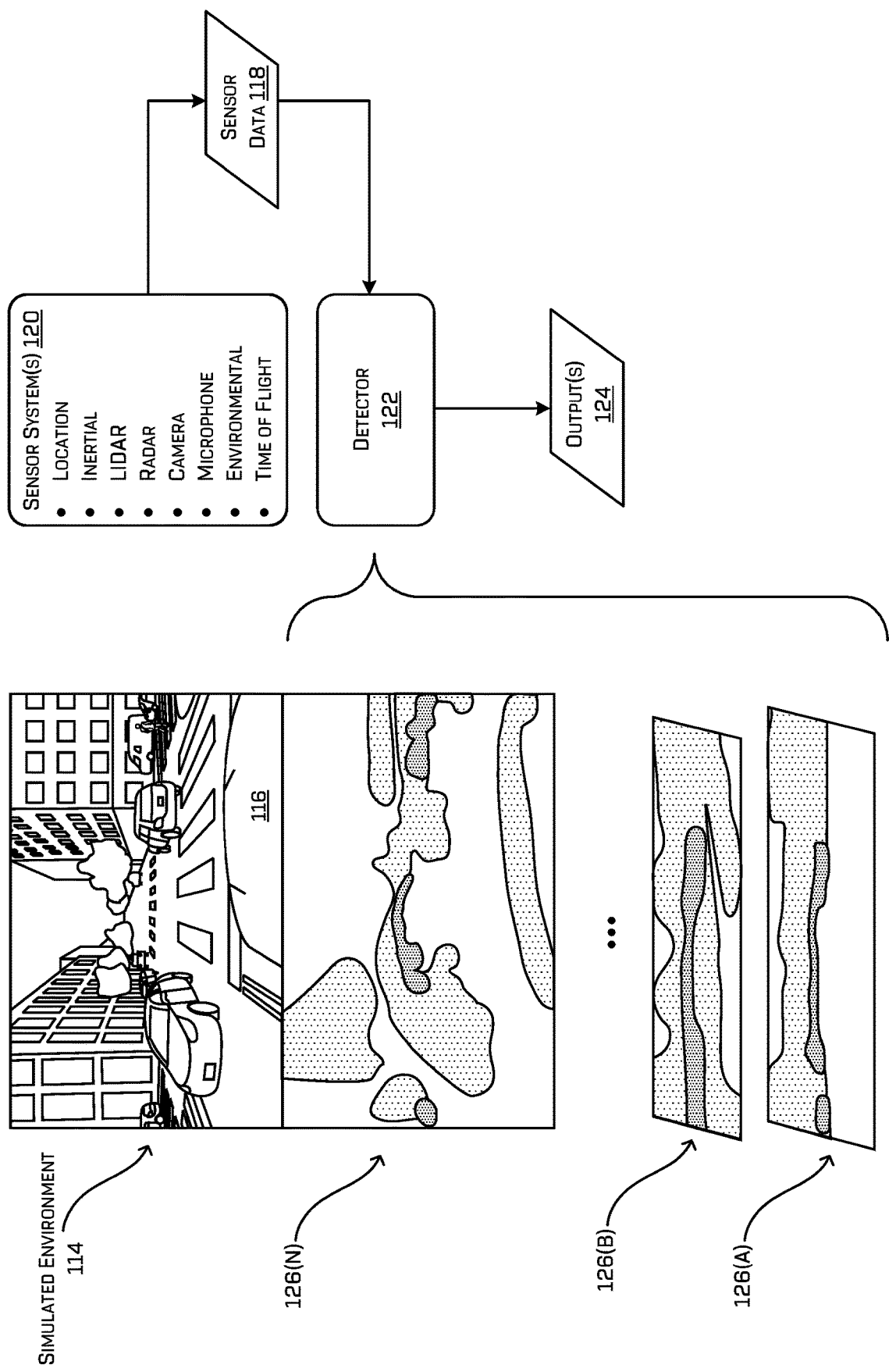
FIG. 1B is an example of a simulated-world environment ("simulated environment") as perceived by a vehicle, as described herein.

FIG. 1B is an example of a simulated environment 114 as perceived by an autonomous vehicle 116. In some examples, the autonomous vehicle 116 can be a real autonomous vehicle or a simulated autonomous vehicle (e.g., one or more onboard systems that would be used in association with an autonomous vehicle). The autonomous vehicle 116 can traverse the simulated environment 114.

In at least one example, simulated environments can be generated using scenario description language, as described in U.S. patent application Ser. No. 15/405,649, filed on Jan. 13, 2017, which claims the benefit of U.S. Provisional Application No. 62/408,641, filed on Oct. 14, 2016, the entire contents of both of which are incorporated by reference herein. In additional or alternative examples, simulated environments can be generated via procedural generation (e.g., creating data algorithmically), as described in U.S. patent application Nos. [to be provided upon filing], filed concurrently herewith, the entire contents of both of which are incorporated by reference herein. Procedural generation can offer various computational benefits, such as smaller file sizes and larger amounts of content.

In some examples, the autonomous vehicle 116 can generate sensor data 118 that can be used to inform maps of the simulated environment 114 and/or inform movement of the autonomous vehicle 116 within the simulated environment 114. For instance, the autonomous vehicle 116 can be equipped with sensor systems 120 that generate sensor data 118 associated with the simulated environment 114. The sensor system(s) 120 can include one or more of the sensors described above with reference to the sensor system(s) 106 described above with reference to FIG. 1A. In at least one example, an autonomous vehicle 116 can utilize one or more systems to analyze the sensor data 118 to map and make determinations about the simulated environment 114 within which it is positioned. For instance, the autonomous vehicle 116 can utilize a detector 122 to analyze the sensor data 118 to map and make determinations about the simulated environment 114 within which it is positioned. Such an autonomous vehicle 116 can utilize the map of the simulated environment 114 to determine trajectories for driving within the simulated environment 114.

The detector 122 can be a system, as described above with reference to detector 108 in FIG. 1A, that analyzes the sensor data 118 and generates one or more outputs 124 based on the sensor data 118. In at least one example, the detector 122 can utilize a neural network to analyze the sensor data 118. Such a neural network can generate intermediate output(s) 126, which can comprise activations (e.g., of a layer of a neural network) that are used by the detector 122 and/or other onboard system(s) to, among other things, map and make determinations concerning the simulated environment 114 within which the autonomous vehicle 116 is positioned. In FIG. 1B, three layers of activations are illustrated (e.g., a first layer 126A, a second layer 126B, and an Nth layer 126N); however, any number of layers of activations can be output by a neural network associated with the detector 122, and need not be the same number as those output by the detector 108. In at least one example, the activations can be analyzed by other onboard system(s) (e.g., a perception system) to classify objects in the simulated environment 114.

FIG. 1B is merely provided for illustrative purposes and should not be construed as limiting.

As described above, in some examples, simulated environments can be useful for enhancing training, testing, and/or validating systems (e.g., one or more components of an AI stack) onboard an autonomous vehicle. For instance, in at least one example, simulated environments can be useful for training systems that are to be used onboard an autonomous vehicle (e.g., models used by such systems), for instance when real data is not readily available, when testing would be unsafe in a real environment, and in order to generate magnitudes more data than would otherwise be available. In at least one example, simulated environments can be used for generating training data for rare or infrequently occurring scenarios and/or objects. Moreover, simulated environments can be useful for testing performance of an autonomous vehicle (e.g., models and/or systems running thereon), for instance, when real environments are either not available or are not safe, or a ground truth is not otherwise available. Furthermore, in some examples, sensor data associated with simulated environments can be more accurate than sensor data associated real environments (e.g., due to occlusions, noise, drift, etc.) in addition to the fact that estimations, based on such simulated sensor data, can be associated with a known result (e.g., a known position/orientation to be compared with a localization algorithm, a known classification/segmentation to be compared with a classification/segmentation algorithm, etc.) and as such, simulated environments can be used for validating observations made in association with real environments. In some examples, simulated environments can be used for calibration (e.g., of one or more sensor systems onboard an autonomous vehicle). Techniques described herein are directed to generating simulated environments and using simulated environments in various scenarios, as described above.

For simulated environments to be useful, it is important that simulated environments realistically resemble real environments, such that the simulated environments generate same and/or substantially similar neural network activations as corresponding real environments. Accordingly, techniques described herein are directed to training a data model (e.g., via machine learning mechanism(s)), as described herein, to determine a similarity (or difference) between simulated environments and real environments, based on comparing activations. The resulting similarity can be used to inform a tuning mechanism to tune one or more systems and/or parameters in an effort to ensure that the simulated environments realistically represent corresponding real environments.

Figure 1C:
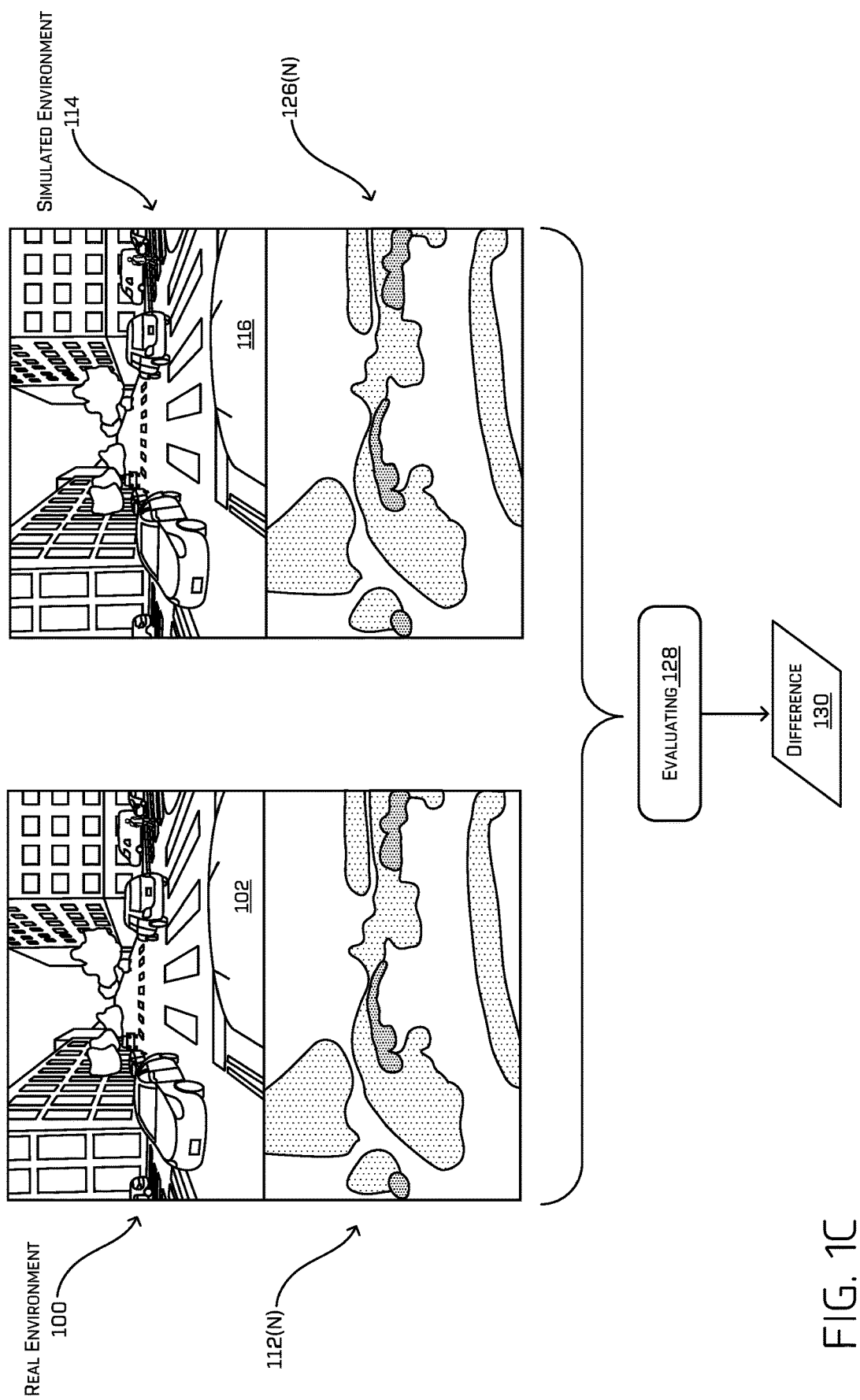
FIG. 1C is an example of comparing the real environment with the simulated environment to determine a similarity between the real environment and the simulated environment, as described herein.

FIG. 1C is an example of comparing the real environment 100 with the simulated environment 114 to determine a similarity between the real environment 100 and the simulated environment 114. For instance, an evaluating system 128 can compare a first intermediate output of the intermediate output(s) 112 (e.g., associated with the real environment) with a second intermediate output of the intermediate output(s) 126 to determine a similarity between the first intermediate output and the second intermediate output. As a non-limiting example, the evaluating system 128 can input real data (an image) and simulated data (a simulated image) into an artificial neural network and can compare activations of the Nth neural network layer 112N associated with the real data input to the network (e.g., of the real environment 100) with activations of the Nth neural network layer 126N associated with input of simulated data to the same network (e.g., of the simulated environment 114) to determine a similarity between activations of the two neural network layers. For the purpose of this discussion, similarity can be represented as a "difference" (e.g., difference 130). A difference below a threshold can indicate that two intermediate outputs are similar, wherein a difference that meets or exceeds the threshold can indicate that two intermediate outputs are not similar.

In at least one example, the evaluating system 128, which is described below with reference to FIG. 2, can utilize a machine-trained model to analyze the first intermediate output and the second intermediate output. The machine-trained model can output a difference 130 indicative of the variation between the activations associated with the first intermediate output (e.g., 112(N)) and the activations associated with the second intermediate output (e.g., 126(N)). In one example, the evaluating system 128, can compare the difference 130 to a threshold and, if the difference 130 meets or exceeds a threshold, the evaluating system 128 can determine that the simulated environment 114 is not likely to output the same (or substantially similar) neural network activations as the corresponding real environment 100 (at least as viewed by the detectors 108, 122). Accordingly, techniques described herein are directed to tuning one or more parameters to improve the similarity (and thus, decrease the difference) between the real environment 100 and the simulated environment 114. The one or more parameters can include, but are not limited to, white balance (e.g., temperature, tint, etc.), color global (e.g., saturation, contrast, gamma, gain, offset, etc.), color shadow (e.g., saturation, contrast, gamma, gain, offset, shadow maximum, etc.), color midtones (e.g., saturation, contrast, gamma, gain, offset, etc.), color highlights (e.g., saturation, contrast, gamma, gain, offset, highlight minimum, etc.), blue correction, gamut, chromatic aberration (e.g., intensity, start offset, etc.), bloom (e.g., method, intensity, threshold, etc.), shutter speed, ISO, exposure (e.g., compensation, metering mode, minimum brightness, low percent, high percent, etc.), histogram log minimum, histogram log maximum, calibration constant, lens flare (e.g., intensity, Bokeh size, threshold, etc.), vignette intensity, grain (e.g., jitter, intensity, etc.), material properties, angles, distance, etc. Different parameters can be adjusted based on the type of output(s) analyzed (e.g., vision, LIDAR, etc.). In at least one example, a machine-trained model can be used to determine which parameters of the one or more parameters are to be tuned and to what extent.

It should be noted that, while the aforementioned description is directed to using a "difference" to determine similarity between real and simulated environments, in additional or alternative examples, any metric can be used to indicate the similarity—or lack thereof—between two data inputs. For instance, in some examples, a distance can be used in addition to, or as an alternative of, a difference.

Figure 1D:
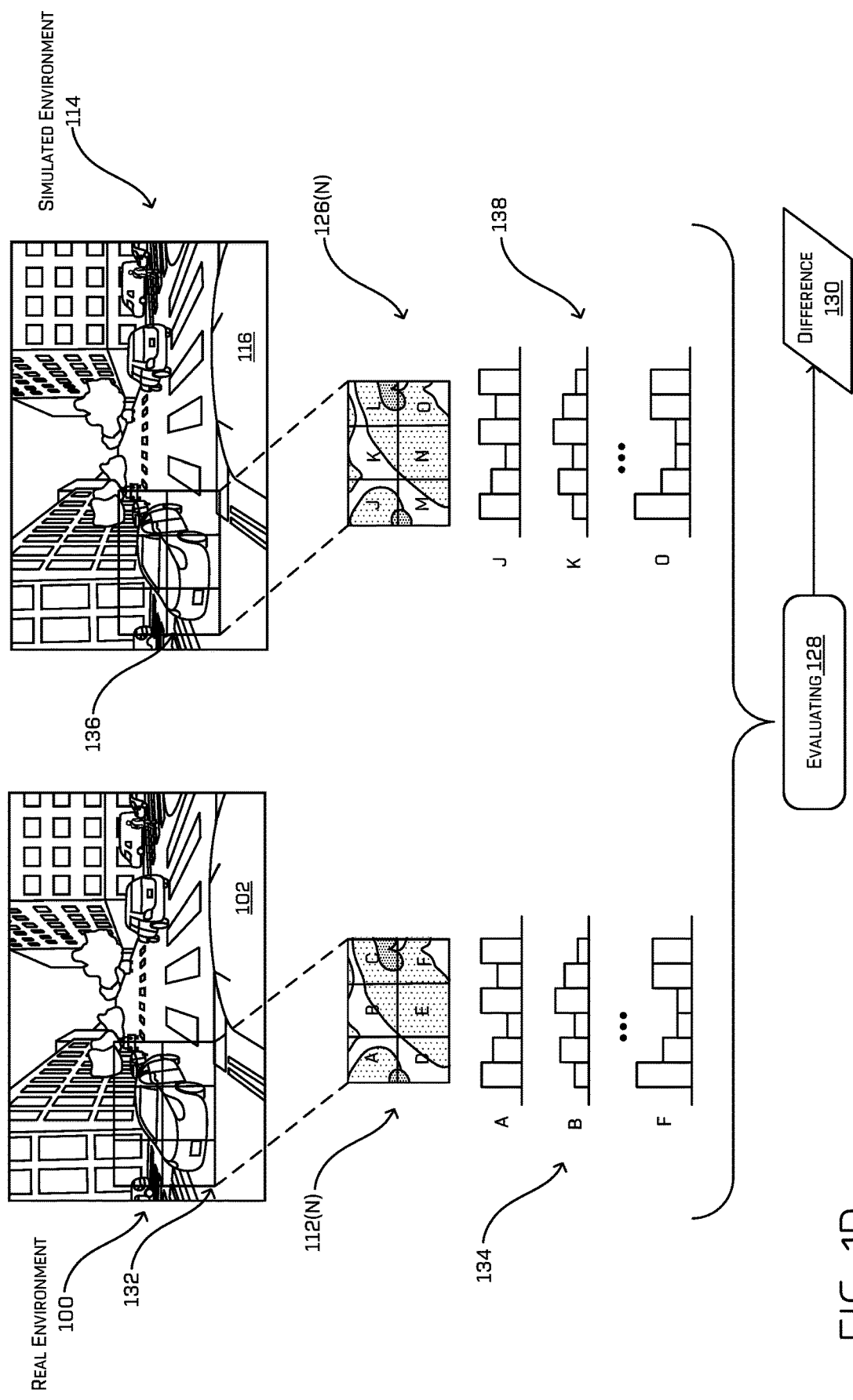
FIG. 1D is an example of comparing the real environment with the simulated environment, using a statistical analysis, to determine a similarity between the real environment and the simulated environment, as described herein.

FIG. 1D illustrates an example of comparing the real environment 100 with the simulated environment 114, using a statistical analysis, to determine a similarity between the real environment 100 and the simulated environment 114, as described herein. That is, in at least one example, the evaluating system 128 can select a region 132 of an input that corresponds to an object, or a portion thereof. In some examples, the region 132 can be output from a detector and/or can be manually selected. The evaluating system 128 can partition the region 132 of a first input into a grid. The region 132 is partitioned into a 3×2 grid, but regions can be partitioned into grids of any dimension (which can be parameterized). Each cell is labeled A-F. In at least one example, the evaluating system 128 can build histograms 134 of activations associated with the cells A-F. For instance, the evaluating system 128 can generate a histogram of activations for each cell of the grid, which are labeled with a corresponding letters A-F. Further, the evaluating system 128 can select a corresponding region 136 of a second input, and can partition the region 136 into a grid. The cells of the grid are labeled J-O. The evaluating system 128 can generate histograms 138 of activations associated with the cells J-O. Any number of divisions can be used for generating the histograms. Though depicted in FIG. 1D for illustrative purposes as having only six discretizations, any number is contemplated. As a non-limiting example, the intermediate output (which may be probabilities, activations, etc.) can be discretized (bucketed) in units of 0.1, creating 10 "buckets" from 0 to 1. In any example, the histogram value for each bucket corresponds to the number of pixels within a cell having corresponding intermediate output.

In an example, the evaluating system 128 can analyze the histograms for example, utilizing a SVM, wherein a distance (e.g., a statistical distance (e.g., $X^2$)) is used to determine how similar the two data sets are. In an example, the evaluating system 128 can compare the histograms 134 and 138 to generate a vector resulting from the comparison of the histograms 134 and 138. The vector can be analyzed by the evaluating system 128 (e.g., utilizing an SVM) to determine a difference 130, which can be used to determine how similar the real environment 100 is to the simulated environment 114.

Figure 2:
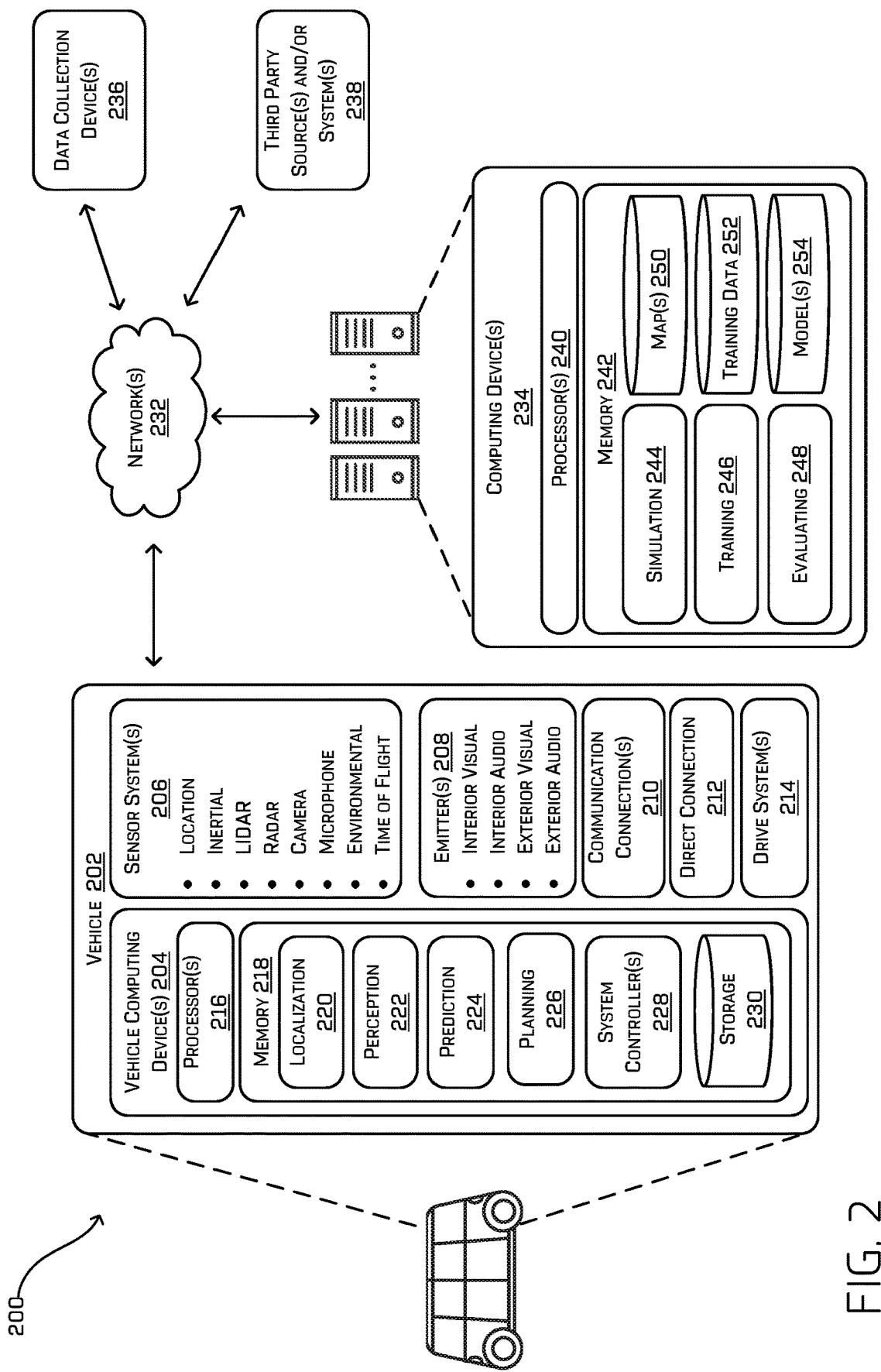
FIG. 2 is a block diagram illustrating an example system for tuning simulated data for optimized neural network activation, as described herein.

FIG. 2 is a block diagram illustrating an example system 200 for tuning simulated data for optimized neural network activation, as described herein. In at least one example, a vehicle 202 can include one or more vehicle computing devices 204, one or more sensor systems 206, one or more emitters 208, one or more communication connections 210, at least one direct connection 212, and one or more drive systems 214. For the purpose of illustration, the vehicle 202 can be an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In such an example, since the vehicle 202 can be configured to control all functions from start to stop, including all parking functions, it can be unoccupied. This is merely an example, and the systems and methods described herein can be incorporated into any ground-borne, airborne, or waterborne vehicle, including those ranging from vehicles that need to be manually controlled by a driver at all times, to those that are partially or fully autonomously controlled. That is, in the illustrated example, the vehicle 202 is an autonomous vehicle; however, the vehicle 202 could be any other type of vehicle.

The vehicle computing device(s) 204 can include processor(s) 216 and memory 218 communicatively coupled with the processor(s) 216. In the illustrated example, the memory 218 of the vehicle computing device(s) 204 stores a localization system 220, a perception system 222, a prediction system 224, a planning system 226, and one or more system controllers 228. Additionally, the memory 218 can include a storage 230, which can store map(s), model(s), etc. A map can be any number of data structures modeled in two dimensions, three dimensions, or N dimensions that are capable of providing information about an environment, such as, but not limited to, topologies (such as intersections), streets, mountain ranges, roads, terrain, and the environment in general. Maps can be associated with real environments or simulated environments. Model(s) can include machine-trained models, as described below.

In at least one example, the localization system 220 can determine a pose (position and orientation) of the vehicle 202 in relation to a local and/or global map based at least in part on sensor data received from the sensor system(s) 206 and/or map data associated with a map (e.g., of the map(s)). In at least one example, the localization system 220 can include, or be associated with a calibration system that is capable of performing operations for calibrating (determining various intrinsic and extrinsic parameters associated with any one or more of the sensor system(s) 206), localizing, and mapping substantially simultaneously. Additional details associated with such a system are described in U.S. patent application Ser. No. 15/675,487, filed on Aug. 11, 2017, which is related to U.S. patent application Ser. No. 15/674,853, filed on Aug. 11, 2017, the entire contents of both of which are incorporated by reference herein.

In at least one example, the perception system 222 can perform object detection, segmentation, and/or classification based at least in part on sensor data received from the sensor system(s) 206. In at least one example, the perception system 222 can receive raw sensor data (e.g., from the sensor system(s) 206). In other examples, the perception system 222 can receive processed sensor data (e.g., from the sensor system(s) 206). For instance, in at least one example, the perception system 222 can receive data from a vision system that receives and processes camera data (e.g., images). In at least one example, the vision system can utilize one or more image processing algorithms to perform object detection, segmentation, and/or classification with respect to object(s) identified in an image. In some examples, the vision system can associate a bounding box (or otherwise an instance segmentation) with an identified object and can associate a confidence score associated with a classification of the identified object. In some examples, objects, when rendered via a display, can be colored based on their perceived class. In at least other examples, similar processes (detection, classification, segmentation, etc.) may be performed by the perception system 222 for one or more other modalities (e.g., LIDAR, RADAR, ToF systems, etc.).

The prediction system 224 can access sensor data from the sensor system(s) 206, map data associated with a map (e.g., of the map(s) which can be in storage 230), and/or perception data output from the perception system 222 (e.g., processed sensor data), and can output predictions associated with one or more objects within the environment of the vehicle 202. In at least one example, the planning system 226 can determine routes and/or trajectories to use to control the vehicle 202 based at least in part on sensor data received from the sensor system(s) 206 and/or any determinations made by the perception system 222. Additional details of localizer systems, perception systems, prediction systems, and/or planning systems that are usable can be found in U.S. Pat. No. 9,612,123, issued on Apr. 4, 2017, and U.S. patent application Ser. No. 15/632,208, filed Jun. 23, 2017, the entire contents of both of which are incorporated by reference herein. In some examples (e.g., where the vehicle 202 is not an autonomous vehicle), one or more of the aforementioned systems and/or components can be omitted from the vehicle 202. While the systems described above are illustrated as "onboard" the vehicle 202, in other implementations, the systems can be remotely located and/or accessible to the vehicle 202.

In at least one example, the localization system 220, the perception system 222, the prediction system 224, and/or the planning system 226 can process sensor data, as described above, and can send their respective outputs over network(s) 232, to computing device(s) 234. In at least one example, the localization system 220, the perception system 222, the prediction system 224, and/or the planning system 226 can send their respective outputs to the computing device(s) 234 at a particular frequency, after a lapse of a predetermined period of time, in near real-time, etc.

In at least one example, the vehicle computing device(s) 204 can include one or more system controllers 228, which can be configured to control steering, propulsion, braking, safety, emitters, communication, and other systems of the vehicle 202. These system controller(s) 228 can communicate with and/or control corresponding systems of the drive system(s) 214 and/or other components of the vehicle 202.

In at least one example, the sensor system(s) 206, which can correspond to sensor system(s) 106 and 120, can include LIDAR sensors, RADAR sensors, ToF sensors, ultrasonic transducers, SONAR sensors, location sensors (e.g., GPS, compass, etc.), inertial sensors (e.g., inertial measurement units, accelerometers, magnetometers, gyroscopes, etc.), cameras (e.g., RGB, IR, intensity, depth, etc.), microphones, wheel encoders, environment sensors (e.g., temperature sensors, humidity sensors, light sensors, pressure sensors, etc.), etc. The sensor system(s) 206 can include multiple instances of each of these or other types of sensors. For instance, the LIDAR sensors can include individual LIDAR sensors located at the corners, front, back, sides, and/or top of the vehicle 202. As another example, the camera sensors can include multiple cameras disposed at various locations about the exterior and/or interior of the vehicle 202. The sensor system(s) 206 can provide input to the vehicle computing device(s) 204. In some examples, the sensor system(s) 206 can preprocess at least some of the sensor data prior to sending the sensor data to the vehicle computing device(s) 204. In at least one example, the sensor system(s) 206 can send sensor data, via the network(s) 232, to the computing device(s) 234 at a particular frequency, after a lapse of a predetermined period of time, in near real-time, etc.

The vehicle 202 can also include one or more emitters 208 for emitting light and/or sound, as described above. The emitter(s) 208 in this example include interior audio and visual emitters to communicate with passengers of the vehicle 202. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The emitter(s) 208 in this example also include exterior emitters. By way of example and not limitation, the exterior emitters in this example include light emitters (e.g., indicator lights, signs, light arrays, etc.) to visually communicate with pedestrians, other drivers, other nearby vehicles, etc., one or more audio emitters (e.g., speakers, speaker arrays, horns, etc.) to audibly communicate with pedestrians, other drivers, other nearby vehicles, etc., etc. In at least one example, the emitter(s) 208 can be disposed at various locations about the exterior and/or interior of the vehicle 202.

The vehicle 202 can also include communication connection(s) 210 that enable communication between the vehicle 202 and other local or remote computing device(s). For instance, the communication connection(s) 210 can facilitate communication with other local computing device(s) on the vehicle 202 and/or the drive system(s) 214. Also, the communication connection(s) 210 can allow the vehicle to communicate with other nearby computing device(s) (e.g., other nearby vehicles, traffic signals, etc.). The communications connection(s) 210 also enable the vehicle 202 to communicate with a remote teleoperations computing device or other remote services.

The communications connection(s) 210 can include physical and/or logical interfaces for connecting the vehicle computing device(s) 204 to another computing device or a network, such as network(s) 232. For example, the communications connection(s) 210 can enable Wi-Fi-based communication such as via frequencies defined by the IEEE 802.11 standards, short range wireless frequencies such as BLUETOOTH®, or any suitable wired or wireless communications protocol that enables the respective computing device to interface with the other computing device(s).

The direct connection 212 can directly connect the drive system(s) 214 and other components of the vehicle 202.

In at least one example, the vehicle 202 can include drive system(s) 214. In some examples, the vehicle 202 can have a single drive system 214. In at least one example, if the vehicle 202 has multiple drive systems 214, individual drive systems 214 can be positioned on opposite ends of the vehicle 202 (e.g., the front and the rear, etc.). In at least one example, the drive system(s) 214 can include sensor system(s) to detect conditions of the drive system(s) 214 and/or the surroundings of the vehicle 202. By way of example and not limitation, the sensor system(s) can include wheel encoder(s) (e.g., rotary encoders) to sense rotation of the wheels of the drive module, inertial sensors (e.g., inertial measurement units, accelerometers, gyroscopes, magnetometers, etc.) to measure position and acceleration of the drive module, cameras or other image sensors, ultrasonic sensors to acoustically detect objects in the surroundings of the drive module, LIDAR sensors, RADAR sensors, etc. Some sensors, such as the wheel encoder(s), can be unique to the drive system(s) 214. In some cases, the sensor system(s) on the drive system(s) 214 can overlap or supplement corresponding systems of the vehicle 202 (e.g., sensor system(s) 206).

The drive system(s) 214 can include many of the vehicle systems, including a high voltage battery, a motor to propel the vehicle 202, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 214 can include a drive module controller which can receive and preprocess data from the sensor system(s) and to control operation of the various vehicle systems. In some examples, the drive module controller can include processor(s) and memory communicatively coupled with the processor(s). The memory can store one or more modules to perform various functionalities of the drive system(s) 214. Furthermore, the drive system(s) 214 also include communication connection(s) that enable communication by the respective drive module with other local or remote computing device(s).

In FIG. 2, the vehicle computing device(s) 204, sensor system(s) 206, emitter(s) 208, and the communication connection(s) 210 are shown onboard the vehicle 202. However, in some examples, the vehicle computing device(s) 204, sensor system(s) 206, emitter(s) 208, and the communication connection(s) 210 can be implemented outside of an actual vehicle (i.e., not onboard the vehicle 202), for instance, as a simulated vehicle or as simulated systems, for use in "traversing" a simulated environment. That is, the vehicle computing device(s) 204, sensor system(s) 206, emitter(s) 208, and the communication connection(s) 210 can be used as a simulated autonomous vehicle for simulation purposes as described above.

As described above, the vehicle 202 can send sensor data to the computing device(s) 234, via the network(s) 232. In some examples, the vehicle 202 can send raw sensor data to the computing device(s) 234. In other examples, the vehicle 202 can send processed sensor data and/or representations of sensor data to the computing device(s) 234 (e.g., data output from the localization system 220, the perception system 222, the prediction system 224, and/or the planning system 226). In some examples, the vehicle 202 can send sensor data to the computing device(s) 234 at a particular frequency, after a lapse of a predetermined period of time, in near real-time, etc.

The computing device(s) 234 can receive the sensor data (raw or processed) from the vehicle 202 and/or one or more data collection devices 236 (which can include other vehicles like vehicle 202), as well as data from one or more third party sources and/or systems 238. In at least one example, the computing device(s) 234 can include processor(s) 240 and memory 242 communicatively coupled with the processor(s) 240. In the illustrated example, the memory 242 of the computing device(s) 234 stores a simulation system 244, a training system 246, an evaluating system 248, a map(s) storage 250 (e.g., storing one or more maps), a training data storage 252 (e.g., storing training data accessible to the training system 246), and a model(s) storage 254 (e.g., models output by the training system 246). In some examples, one or more of the systems and/or storage repositories can be associated with the vehicle 202 instead of, or in addition to, being associated with the memory 242 of the computing device(s) 234.

The simulation system 244 can generate simulated environments. In at least one example, the simulation system 244 can generate simulated environments via procedural generation (e.g., creating data algorithmically), as described above. The simulation system 244 described herein can simulate one or more sensor modalities (e.g., LIDAR, RADAR, ToF, SONAR, images (e.g., RGB, IR, intensity, depth, etc.), etc.).

In at least one example, the evaluating system 248 can evaluate how "realistic" a simulated environment, or a portion thereof, is relative to a corresponding real environment using the perception system 222 (or another system, such as the detector 108 and/or detector 120 as described above with reference to FIGS. 1A and 1B, that inputs data into the perception system 222 (e.g., vision system, LIDAR system, etc.)). For the purpose of this discussion, "realistic" can be used to describe how well the perception system 222 (or other neural network) responds to a particular input associated with a simulated environment. In at least one example, the evaluating system 248 can correspond to the evaluating system 128 described above with reference to FIG. 1C. The evaluating system 248 can receive data (which can correspond to intermediate output(s) 112 and/or intermediate output(s) 126 as described above with reference to FIGS. 1A and 1B) and can evaluate whether a simulated environment is realistic based at least in part on the perception data. That is, the evaluating system 248 can receive perception data (which can correspond to intermediate output(s) 112 and/or intermediate output(s) 126 as described above with reference to FIGS. 1A and 1B) and can evaluate whether neural network activity associated with the simulated environment 114 is similar to neural network activity associated with a corresponding real environment 102.

In some examples, two environments (e.g., real vs. simulated) can look different to a human, but can be perceived as the same to, for example, a robotic system (e.g., an autonomous vehicle) as defined herein (e.g., based on activations). In at least one example, the evaluating system 248 can analyze the perception data using a machine-trained model to evaluate neural network activity associated with a simulated environment. For instance, in at least one example, the evaluating system 248 can analyze a first intermediate output of the vision system (e.g., based on a simulated environment) with a second intermediate output of the vision system (e.g., based on a corresponding real environment) and can determine a similarity metric (e.g., a difference) that can be representative of how similar the perception system 222 views the simulated environment when compared to the corresponding real environment (e.g., how similar the networks are activated). In at least one example, the intermediate outputs can be activations which can be analyzed by a machine-trained model to determine whether the vision system perceives the simulated environment the same way that it perceives the real environment. Similar evaluations can be performed on other data that can be used by the perception system 222 (e.g., LIDAR, etc.).

In at least some examples, such activations can be compared by discretizing a region of an input space (e.g., a region of input data, a region of an input image, etc.) into corresponding grids and building histograms of activations in the associated grids for input data and comparison data. Once determined, the histograms may be analyzed, for example, by a SVM, wherein a distance (e.g., a statistical distance) is used to determine how similar the two data sets are. Additional details are described above with reference to FIG. 1D.

In some examples, different sensor data types can be associated with different parameters of interest (e.g., different parameters that are tuned to improve the neural network activity associated with a simulated environment so that the neural network activity more closely resembles the neural network activity of a corresponding real environment). For instance, with the vision system, the parameters of interest can be brightness, exposure, etc., and with the LIDAR system, the parameters of interest can be angles, distance, intensity, sensor modalities, etc. Additional details associated with evaluating a simulated environment, or a portion thereof, is relative to a corresponding real environment are described below with reference to FIG. 4.

In at least one example, the training system 246 can train a data model to learn which parameters matter for the perception system 222 (e.g., what parameters matter such that the perception system 222 can perceive the simulated environment as though it is perceiving the real environment). That is, in at least one example, the training system 246 can train a data model to evaluate neural network activity based on one or more identified parameters.

In an example, the training system 246 can analyze perception data (e.g., intermediate output(s) 110 as described above with reference to FIG. 1A) to determine and evaluate similarities and/or differences between pairs of observations of a real environment. In at least one example, the training system 246 can compare a first intermediate output associated with a real environment and a second intermediate output associated with a real environment to determine a similarity metric (e.g., a difference) representative of the similarity between the first intermediate output and the second intermediate output. In some examples, the first intermediate output and the second intermediate output can correspond to sensor data (e.g., an image, LIDAR data, RADAR data, etc.), portions of such data (e.g., regions that correspond to objects or regions having interesting features), portions of an object, etc. For instance, in at least one example, the first intermediate output can be associated with a first perceived object in a first image associated with a real environment and the second intermediate output can be associated with a second perceived object in a second image associated with a real environment. In some examples, the first perceived object and the second perceived object can overlap. In other examples, the first image may be a first acquired image in a video sequence and the second image may be an image acquired within some period of time (e.g., within 1-5 frames). In any such an example, objects detected in the first image may be the same objects present in the second image, differing only slightly with respect to position, orientation, illumination, occlusion, etc.

In some examples, the training system 246 can train a data model to output the similarity score (which can represent a similarity between two images, or portions thereof). As described above, the similarity score can be a difference. In such examples, the data model can be trained on real data such that data (e.g., images) associated with a same object are associated with a same (or substantially similar) similarity score (e.g., two sequential images of a vehicle in a video sequence should be associated with the same activations), data (e.g., images) associated with of objects that are slightly different or similar (e.g., a moving vehicle observed a determined time apart (e.g., 2 seconds), a vehicle as observed from a different perspective, similar looking vehicles, etc.) have a larger distance between respective similarity scores than objects that are exactly the same, but a smaller distance between respective similarity scores than completely different objects, and data (e.g., images) associated with different objects have a large distance between similarity scores. In at least one example, the similarity score can be determined based on one or more metrics, which can include, but are not limited to, differences of histograms of pixel confidences computed over a grid, a convolution score, etc.

In at least one example, the training system 246 can build a "different" data set, representative of pairs of data (e.g., images) associated with different objects (or portions thereof). The "different" data set can include one or more combinations of pairs of objects in pairs of data (e.g., images) of real environments. Such differences in real data can be used to train, for example, the SVM, in order to determine a similarity metric (e.g., a difference) between real data and simulated data. In some examples, for instance, for those examples comparing simulated LIDAR data and real LIDAR data, metrics may be computed on a per voxel metric based, at least in part, on a number of returns.

In at least one example, the training system 246 can compute similarities (or the absence thereof (e.g., differences)) of activations from a layer of the neural network (e.g., the top layer) for pairs of objects (or portions thereof) in a pair of data (e.g., images). In at least one example, a data set can include multiple pairs of images that depict different objects. In such an example, the training system 246 can compute similarities between pairs of (different) objects (or portions thereof) in each of the pairs of images associated with the data set. The resulting similarities can comprise the "different" data set.

In at least one example, the training system 246 can build a "same" data set, representative of pairs of data (e.g., images) associated with of same objects (or portions thereof). The "same" data set can include one or more combinations of pairs of the same objects in pairs of data (e.g., images) in real environments. In at least one example, the training system 246 can compute similarities (or the absence there of (e.g., differences)) of activations from a layer of the neural network (e.g., the top layer) for pairs of (the same) objects in a pair of data (e.g., images). In at least one example, a data set can include multiple pairs of data (e.g., images). In such an example, the training system 246 can compute similarities between pairs of (the same) objects in each of the pairs of data (e.g., images) associated with a data set. The resulting similarities (or the absence there of (e.g., differences)) can comprise the "same" data set.

In at least one example, the training system 246 can build a "similar" data set. In some examples, the "similar" data set can include a "moving" data set, representative of pairs of images of objects (or portions thereof) in a log of recorded data (e.g., consecutive image frames). The "moving" data set can include one or more combinations of pairs of similar objects (e.g., that differ by way of motion of one of the objects) in pairs of data (e.g., images) associated with real environments. In at least one example, the training system 246 can compute similarities (or the absence there of (e.g., differences)) of activations from a layer of the neural network (e.g., the top layer) for pairs of (moving) objects in a pair of data (e.g., images). In at least one example, a data set can include multiple pairs of data (e.g., images). In such an example, the training system 246 can compute similarities (or the absence there of (e.g., differences)) of pairs of (moving) objects in each of the pairs of data (e.g., images) associated with a data set. The resulting similarities can comprise the "moving" data set. Regardless, the "moving"

dataset comprise data representative of objects having differing orientations, relative positions to the data sensor, occlusion, illumination, and the like due to motion of the objects in the environment.

Additionally, the "similar" data set can include representative pairs of data (e.g., images) associated with objects (or portions thereof) that are slightly different from one another. For instance, in an example, a first image can be associated with a different time of day, time of year, or the like than the other image in a pair of images. Additionally or alternatively, a first image can be associated with a different camera angle, different sensor (e.g., cameras of differing resolutions, field of view, distortion, etc.), than the other image in a pair of images. Further, a first image can be associated with a different type of weather than the other image in a pair of images. The "similar" data set can include one or more combinations of pairs of similar objects in pairs of data (e.g., images) associated with real environments. In at least one example, the training system 246 can compute similarities (or the absence there of (e.g., differences)) of activations from a layer of the neural network (e.g., the top layer) for pairs of (similar) objects in a pair of data (e.g., images). In at least one example, a data set can include multiple pairs of data (e.g., images). In such an example, the training system 246 can compute similarities (or the absence there of (e.g., differences)) of pairs of (similar) objects in each of the pairs of data (e.g., images) associated with a data set. The resulting similarities can comprise the "moving" data set.

The training data, which can include similarities between objects in the "different" data set, the "same" data set, and the "similar" data set, can be stored in the training data storage 252. In at least one example, the training system 246 can access the training data and the training system 246 can use a machine learning mechanism to train a data model to distinguish between same objects and different objects. For instance, the training system 246 can utilize a SVM for training the data model. In some examples, the training system 246 can train the data model using different combinations of the training data. For instance, the training system 246 can leverage a two-class SVM to discriminate between same/similar and different data sets, a two-class SVM to discriminate between same and different/moving data sets, a three-class SVM, and/or a two-class SVM to discriminate between same and different data sets.

Although discussed in the context of SVMs, any type of machine learning can be used consistent with this disclosure. For example, machine learning algorithms for training machine learned model(s) can include, but are not limited to, regression algorithms (e.g., ordinary least squares regression (OLSR), linear regression, logistic regression, stepwise regression, multivariate adaptive regression splines (MARS), locally estimated scatterplot smoothing (LOESS)), example-based algorithms (e.g., ridge regression, least absolute shrinkage and selection operator (LASSO), elastic net, least-angle regression (LARS)), decisions tree algorithms (e.g., classification and regression tree (CART), iterative dichotomiser 3 (ID3), Chi-squared automatic interaction detection (CHAID), decision stump, conditional decision trees), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), association rule learning algorithms (e.g., perceptron, back-propagation, hopfield network, Radial Basis Function Network (RBFN)), deep learning algorithms (e.g., Deep Boltzmann Machine (DBM), Deep Belief Networks (DBN), Artificial Neural Network (ANN), Convolutional Neural Network (CNN), Stacked Auto-Encoders), Dimensionality Reduction Algorithms (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), SVM (support vector machine), supervised learning, unsupervised learning, semi-supervised learning, etc.

Additional details associated with training the model(s) are described below with reference to FIG. 3.

The resulting data model(s) can be stored in the model(s) storage 254 and can be accessed by the evaluating system 248 for evaluating neural network activity associated with simulated environments.

As described above, in at least one example, the evaluating system 248 can analyze perception data using a machine-trained model (e.g., as described above) to evaluate neural network activity associated with a simulated environment. In at least one example, the evaluating system 248 can utilize the machine-trained model to compare a first intermediate output associated with a real environment and a second intermediate output associated with a corresponding simulated environment to determine a similarity metric (e.g., a difference) representative of the similarity between the first intermediate output and the second intermediate output. In some examples, the first intermediate output and the second intermediate output can correspond to data (e.g., images), portions of data (e.g., that correspond to individual objects associated with the data), etc. For instance, in at least one example, the first intermediate output can be associated with a first perceived object in an image associated with the real environment and the second intermediate output can be associated with a second perceived object in an image associated with the simulated environment. If the similarity metric (e.g., the difference) does not meet a threshold (e.g., the first intermediate output and the second intermediate output are similar), the evaluating system 248 can determine that the simulated environment creates similar neural network activity as the real environment. However, if the similarity metric (e.g., the difference) meets or exceeds the threshold, the evaluating system 248 can tune one or more parameters to observe changes to the one or more metrics. For instance, the evaluating system 248 can tune parameters such as brightness, exposure, etc. for improving photorealism. When the similarity metric (e.g., the difference) is below the threshold (e.g., the first intermediate output and the second intermediate output are similar), the evaluating system 248 can determine that the simulated environment creates similar neural network activity as the real environment.

In at least some examples, a similarity score output from the trained SVM (or otherwise) can be used as an input to another machine learning algorithm and/or optimization. Such an algorithm may incorporate the determined similarity metric as a loss function so that the model learns which parameters can be tuned to create simulated data (e.g., simulated images, LIDAR, RADAR, etc.) which causes activations in neural networks used to evaluate real data. The model and/or optimization may be run until convergence. As above, various parameters which may be output from such an algorithm include, but are not limited to, a size of the grid used as input to the SVM, brightness, exposure, distance, Bayer filtering, number of histogram bins, a bireflectance distribution function (BRDF), noise, optical components and/or distortion, Schott noise, dark current, etc.

As described above, simulated environments can be useful for enhancing training, testing, and/or validating systems (e.g., one or more components of an AI stack) onboard an autonomous vehicle, such as vehicle 202. In at least one example, simulated environments can be useful for training data models where training data from real environments is insufficient (e.g., as is the case with rare objects, rare scenarios, etc.). In such examples, a resulting data model can be provisioned to, or accessible by, the vehicle 202, and the vehicle 202 can utilize the data model for classifying objects in real-time (e.g., while driving or otherwise operating in the real environment). That is, the perception system 222 can utilize the data model (trained based on simulated data associated with a simulated environment) onboard in near real-time to classify objects.

As a non-limiting example, training data from real environments is insufficient for training the vehicle 202 to recognize rare events/objects (e.g., traffic lights types that are not frequently seen). In at least one example, by comparing simulated environments with real environments, the data model can learn that particular parameters matter for training a traffic light classifier. For instance, such parameters can include bulb discoloration, shading, lens distortion, dirt on the light, a burnt-out filament, variation in brightness, bulb rotation, bulb intensity, etc. Based on identifying the parameters, the training system 246 can tune simulated environments associated with traffic lights and can train a traffic light classifier based on the tuned simulated environments. Such a classifier can be provisioned to, or accessible by, the vehicle 202, and the vehicle 202 can utilize the data model for classifying traffic lights in real-time. For instance, the perception system 222 can utilize the classifier (trained based on simulated data used to generate a simulated environment) onboard in near real-time to classify traffic lights. That is, as described above, in at least one example, a classifier can be trained on simulated data and used for evaluating real data. In some examples, the classifier can be trained on real data and validated using simulated data. In such examples, identified discrepancies can be used to improve the classifier. In at least some instances, such rare examples may be identified by training, for example, a traffic light detector based on simulated image data, running the detector on real data, and determining where detections were missed. Similarly, determining that simulated parameters are not correct may comprise training an algorithm (e.g. the same detector as above) on real data, running such a detector on simulated data, and detecting missed objects.

Furthermore, simulated environments can be useful for validating and/or updating a localization algorithm used by the localization system 220. For instance, in real environments, GPS sensors experience positional drifts and may, as a result, accumulate error. Accordingly, to validate a localization algorithm that is used for localizing the vehicle 220, the evaluating system 248 can use a simulated environment, where the pose of the vehicle 202 is known at various times (including at all times) and evaluate the sensor data associated with a corresponding real environment to validate the localization algorithm (e.g., by relying on simulated poses as position and/or orientation ground truth). In such an example, the sensor system(s) 206 can generate sensor data associated with the simulated environment and the sensor data can be analyzed by the perception system 222. An output of the perception system 222 (e.g., associated with a position in a real environment) can be validated in view of the sensor data associated with the corresponding position in the simulated environment. That is, the sensor data associated with a position in a simulated environment can serve as the ground truth for the corresponding position in the real environment. As an example, LIDAR data recorded in association with a simulated environment (e.g., where the pose of the vehicle 102 is known) can be compared to LIDAR data recorded in association with a corresponding position in a real environment and the localization algorithm can be updated as appropriate. Furthermore, simulated environments can be useful for validating RADAR or other sensors of the sensor system(s) 206. In some examples, simulated environments can offer ground truth data for calibrating sensors (e.g., of the sensor system(s) 106). Other examples include, but are not limited to validating rolling shutter in simulation, calibration (e.g., of one or more of intrinsics or extrinsics) of various sensors, and the like. As would be appreciated, the techniques described herein may be used in validation, calibration, training, etc. for various other systems, subsystems, etc.

The processor(s) 216 of the vehicle 202 and the processor(s) 240 of the computing device(s) 234 can be any suitable processor capable of executing instructions to process data and perform operations as described herein. By way of example and not limitation, the processor(s) 216 and 240 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

Memory 218 and 242 are examples of non-transitory computer-readable media. Memory 218 and 242 can store an operating system and one or more software applications, instructions, programs, and/or data to implement the methods described herein and the functions attributed to the various systems. In various implementations, the memory can be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

It should be noted that while FIG. 2 is illustrated as a distributed system, in alternative examples, components of the vehicle 202 can be associated with the computing device(s) 234 and/or components of the computing device(s) 234 can be associated with the vehicle 202. That is, the vehicle 202 can perform one or more of the functions associated with the computing device(s) 234, and vice versa.

Figure 3:
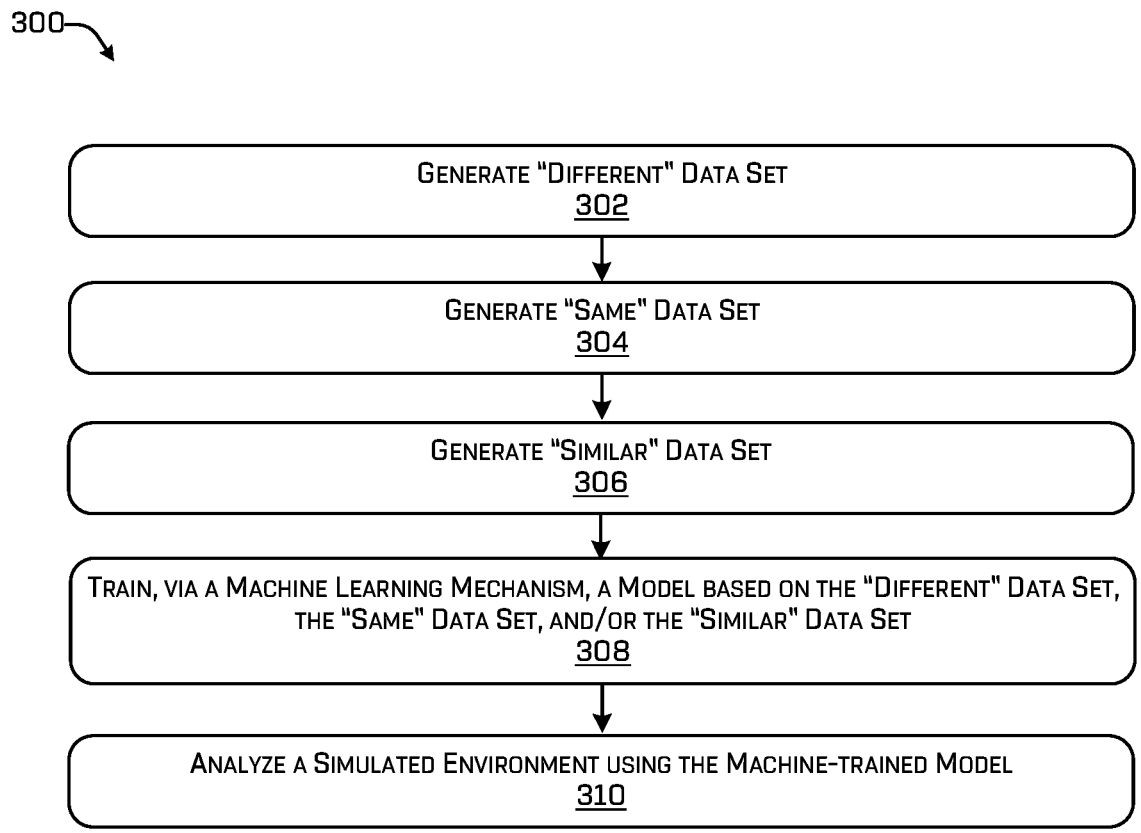
FIG. 3 illustrates an example process of training a data model for evaluating neural network activity associated with simulated environments, as described herein.
Figure 4:
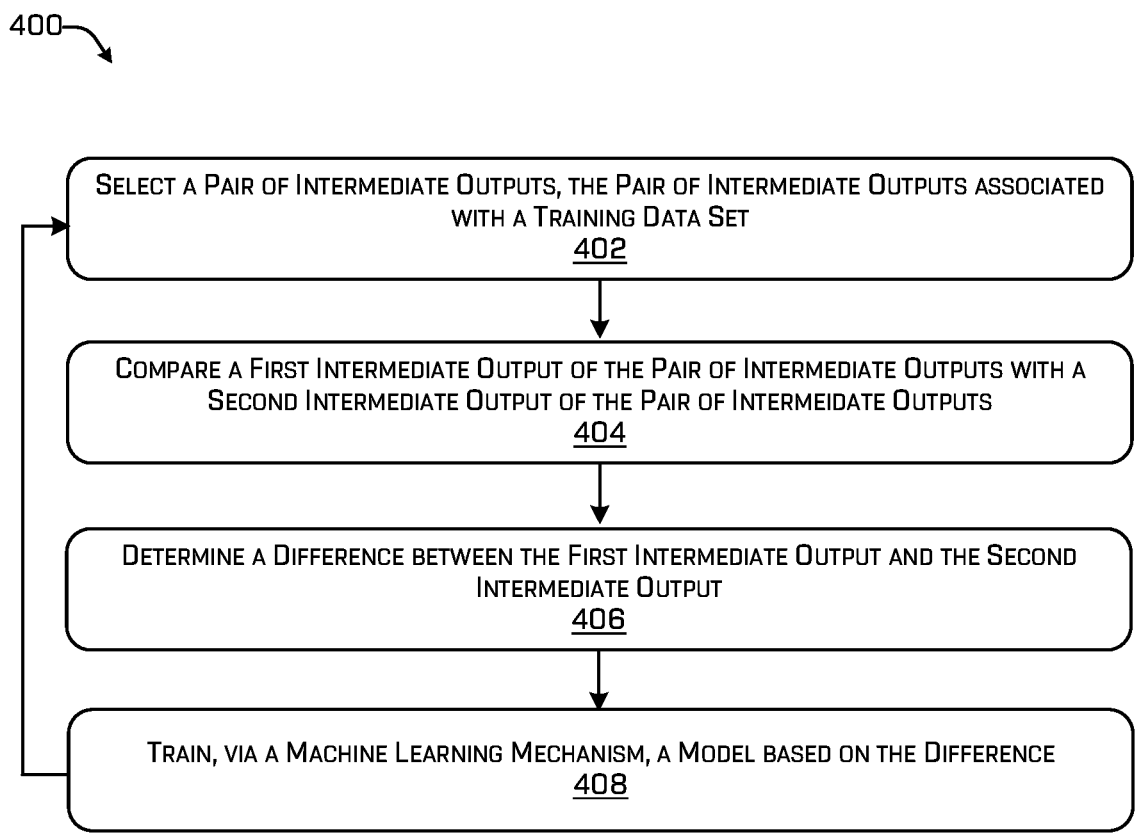
FIG. 4 illustrates another example process of training a data model for evaluating neural network activity associated with simulated environments, as described herein.
Figure 5:
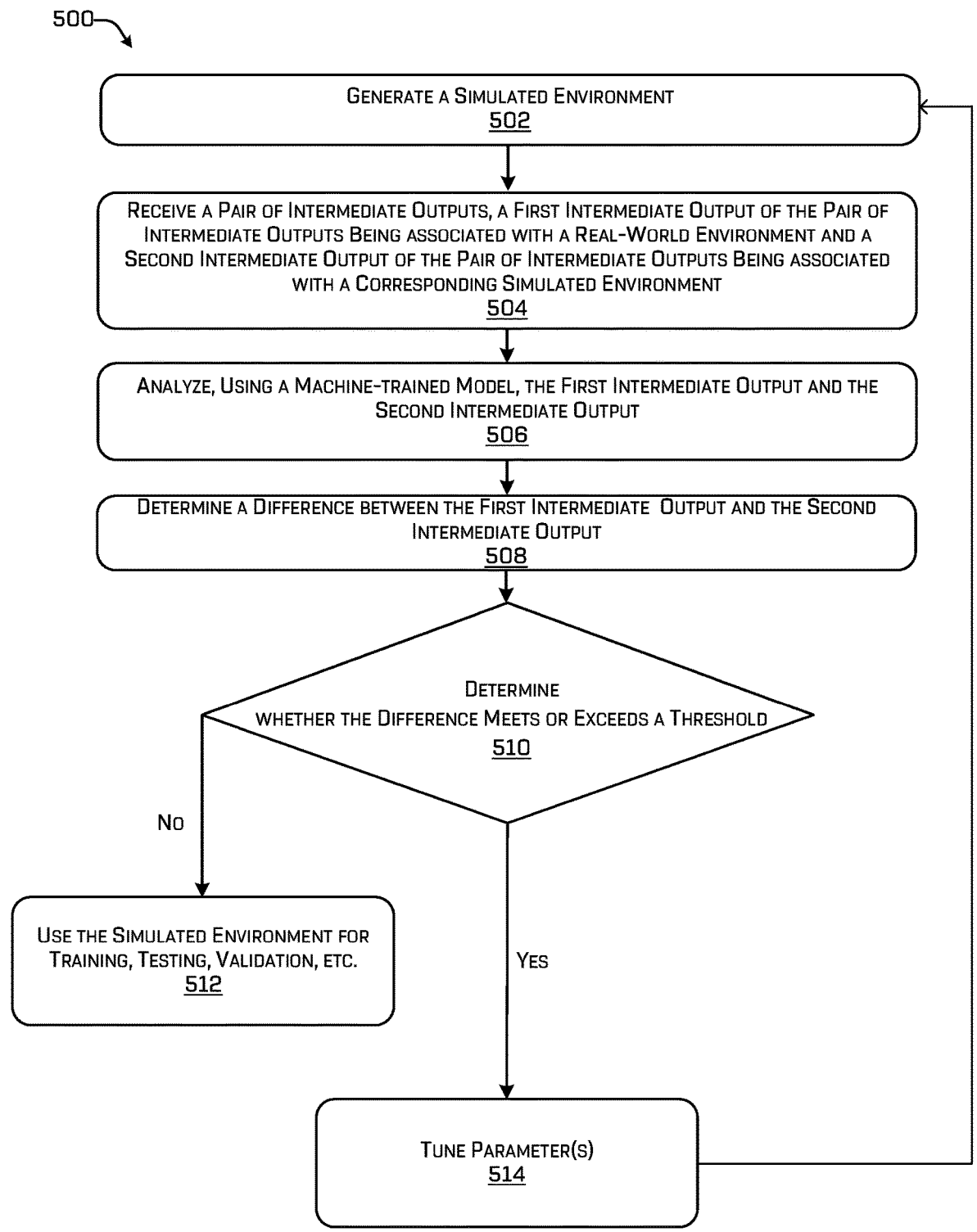
FIG. 5 illustrates an example process for tuning simulated data for optimized neural network activation, as described herein.

FIGS. 3-5 are flowcharts showing example methods involving techniques as described herein. The methods illustrated in FIGS. 3-5 are described with reference to the system 200 shown in FIG. 2 for convenience and ease of understanding. However, the methods illustrated in FIGS. 3-5 are not limited to being performed using the system 200. Moreover, the system 200 described herein is not limited to performing the methods illustrated in FIGS. 3-5.

The methods 300-500 are illustrated as collections of blocks in logical flow graphs, which represent sequences of operations that can be implemented in hardware, software, or a combination thereof. In the context of software, the blocks represent computer-executable instructions stored on one or more computer-readable storage media that, when executed by processor(s), perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes. In some embodiments, one or more blocks of the process can be omitted entirely. Moreover, the methods 300-500 can be combined in whole or in part with each other or with other methods.

FIG. 3 illustrates an example process 300 of training a data model for evaluating neural network activity associated with simulated environments, as described herein.

As described above, the training system 246 can generate a corpus of training data, which can include pairs of neural network activations that are associated with "different," "same," and/or "similar" subjects (e.g., data (e.g., images), portions of data, objects, portions of objects, etc.). Blocks 302-306 are directed to the generation of the training data. As described above, the training data can be stored in the training data storage 252. While FIG. 3 illustrates the generation of three separate data sets, in other examples, the training data may comprise any of the "different," "same," and/or "similar" data sets.

Block 302 illustrates generating a "different" data set. In at least one example, the training system 246 can build a "different" data set, representative of pairs of data (e.g., images) of different objects (or portions thereof). The "different" data set can include one or more combinations of pairs of objects in pairs of data (e.g., images) associated with real environments. The objects can be different, or the portions of the images analyzed for the purpose of comparison can be different. Such different objects (or portions thereof) can be observed and such differences can be represented as a difference. The difference can be used to train, for example, the SVM, in order to determine a similarity metric (e.g., a difference) between real data and simulated data. In some examples, for instance, for those examples comparing simulated LIDAR data and real LIDAR data, metrics may be computed on a per voxel metric based, at least in part, on a number of returns. The pairs of images and associated differences can comprise the "different" data set.

Block 304 illustrates generating a "same" data set. In at least one example, the training system 246 can build a "same" data set, representative of pairs of data (e.g., images) associated with same objects (or portions thereof). The "same" data set can include one or more combinations of pairs of objects in pairs of data (e.g., images) associated with real environments. In at least one example, both of the objects or portions of the data (e.g., images) analyzed for the purpose of comparison can be the same (or substantially similar). In at least one example, the training system 246 can compute similarities (or the absence thereof (e.g., differences)) of activations from a layer of the neural network (e.g., the top layer) for pairs of objects in a pair of data (e.g., images). The pairs of images and resulting similarities (or the absence there of (e.g., differences)) can comprise the "same" data set.

Block 306 illustrates generating a "similar" data set. In at least one example, the training system 246 can build a "similar" data set. In some examples, the "similar" data set can include a "moving" data set, representative of pairs of images of objects (or portions thereof) in a log of recorded data (e.g., consecutive image frames). The "moving" data set can include one or more combinations of pairs of similar objects (e.g., that differ by way of motion of one of the objects) in pairs of data (e.g., images) associated with real environments. In at least one example, the training system 246 can compute similarities (or the absence there of (e.g., differences)) of activations from a layer of the neural network (e.g., the top layer) for pairs of (moving) objects in a pair of data (e.g., images). In at least one example, a data set can include multiple pairs of data (e.g., images). In such an example, the training system 246 can compute similarities (or the absence there of (e.g., differences)) of pairs of (moving) objects in each of the pairs of data (e.g., images) associated with a data set. The resulting similarities can comprise the "moving" data set. Regardless, the "moving" dataset comprise data representative of objects having differing orientations, relative positions to the data sensor, occlusion, illumination, and the like due to motion of the objects in the environment.

Additionally, the "similar" data set can include representative pairs of images of objects (or portions thereof) that are slightly different from one another in some way other than movement. For instance, in an example, a first image can be associated with a different time of day, time of year, or the like than the other image in a pair of images. Additionally or alternatively, a first image can be associated with a different camera angle, different sensor (e.g., cameras of differing resolutions, field of view, distortion, etc.), than the other image in a pair of images. Further, a first image can be associated with a different type of weather than the other image in a pair of images. Other variations between individual images in the pairs of images are within the scope of this disclosure.

Block 308 illustrates training, via a machine learning mechanism, a model based on the "different" data set, "same" data set, and/or "similar" data set. In at least one example, the training system 246 can access the training data and the training system 246 can use a machine learning mechanism to train a data model to distinguish between same objects and different objects. For instance, the training system 246 can utilize a SVM for training the data model. In some examples, the training system 246 can train the data model using different combinations of the training data. For instance, the training system 246 can leverage a two-class SVM to discriminate between same/similar and different data sets, a two-class SVM to discriminate between same and different/moving data sets, a three-class SVM, and/or a two-class SVM to discriminate between same and different data sets. As described above, machine-learning mechanisms other than an SVM can be used for training model(s).

Additional details associated with training a model are described below with reference to FIG. 4.

Block 310 illustrates analyzing a simulated environment using the machine-trained model, as described below with reference to FIG. 5. Results of analyzing simulated environments can be utilized for retraining and/or optimizing the model.

FIG. 4 illustrates another example process 400 of training a data model for evaluating neural network activity associated with simulated environments, as described herein.

Block 402 illustrates selecting a pair of intermediate outputs, the pair of intermediate outputs associated with a training data set. As described above, in an example, the training system 246 can analyze data (which can correspond to intermediate output(s) 110 as described above with reference to FIG. 1A) to determine and evaluate similarities and/or differences between observations of real environments. In some examples, the training system 246 can select a first intermediate output and a second intermediate output. In at least one example, the first intermediate output and the second intermediate output can correspond to sensor data (e.g., an image, LIDAR data, RADAR data, etc.), portions of such data (e.g., regions that correspond to objects or regions having interesting features), portions of an object, etc. For instance, in at least one example, the first intermediate output can be associated with a first perceived object in a first image associated with a real environment and the second intermediate output can be associated with a second perceived object in a second image associated with a real environment.

Block 404 illustrates comparing a first intermediate output of the pair of intermediate outputs with a second intermediate output of the pair of intermediate outputs. In at least one example, the training system 246 can compare a first intermediate output associated with a real environment and a second intermediate output associated with a real environment to determine a similarity metric (e.g., a difference) representative of the similarity between the first intermediate output and the second intermediate output, as illustrated in block 406. In at least one example, the training system 246 can compare neural network activations of the intermediate outputs, which are associated with a same layer of a neural network, to determine the similarity metric.

Block 408 illustrates training, via a machine learning mechanism, a model based on the difference. In some examples, the training system 246 can train a data model to output the similarity score (which can represent a similarity between two images, or portions thereof). As described above, the similarity score can be a difference or other metric (e.g., distance) that represents a distance between two intermediate outputs. In such examples, the data model can be trained on real data such that data associated with a same object are associated with a same (or substantially similar) similarity score (e.g., two sequential images of a vehicle in a video sequence should be associated with the same activations), data associated with of objects that are slightly different or similar (e.g., a moving vehicle observed a determined time apart (e.g., 2s), a vehicle as observed from a different perspective, similar looking vehicles, etc.) have a larger distance between respective similarity scores than objects that are exactly the same, but a smaller distance between respective similarity scores than objects of completely different objects, and data associated with different objects have a large distance between similarity scores. In at least one example, the similarity score can be determined based on one or more metrics, which can include, but are not limited to, differences of histograms of pixel activations computed over a grid, a convolution score, etc.

In some examples, process 400 can return to block 402 to retrain and/or optimize the model.

FIG. 5 illustrates an example process 500 for tuning simulated data for optimized neural network activation, as described herein.

Block 502 illustrates generating a simulated environment. As described above, the simulation system 244 can generate simulated environments. In at least one example, the simulation system 244 can generate simulated environments via procedural generation (e.g., creating data algorithmically), as described above.

Block 504 illustrates receiving a pair of intermediate outputs, a first intermediate output of the pair of intermediate outputs being associated with a real environment and a second intermediate output of the pair of intermediate outputs being associated with a corresponding simulated environment. In at least one example, the evaluating system 248 can receive data (which can correspond to intermediate output(s) 112 and/or intermediate output(s) 126 as described above with reference to FIGS. 1A and 1B) associated with corresponding portions of a real environment and a simulated environment, and can evaluate whether a simulated environment has the same (or substantially similar) neural network activations. In some examples, two environments (e.g., real vs. simulated) can look different to a human, but can be perceived as the same to, for example, a robotic system (e.g., an autonomous vehicle) as defined herein (e.g., based on activations).

Block 506 illustrates analyzing, using a machine-trained model, the first intermediate output and the second intermediate output. In at least one example, the evaluating system 248 can analyze the perception data using a machine-trained model to evaluate neural network activity associated with of a simulated environment. For instance, in at least one example, the evaluating system 248 can analyze a first intermediate output of the vision system (e.g., based on a simulated environment) with a second intermediate output of the vision system (e.g., based on a corresponding real environment) and can determine a similarity metric (e.g., a difference) that can be representative of how similarly the simulated environment and the real environment activate a neural network. In at least one example, the intermediate outputs can be activations which can be analyzed by a machine-trained model to determine whether the vision system perceives the simulated environment the same way that it perceives the real environment. Similar evaluations can be performed on other data that can be used by the perception system 222 (e.g., LIDAR, etc.). In at least some examples, such activations can be compared by discretizing a region of an input space into corresponding grids and building histograms of activations in the associated grids for input data and comparison data. Once determined, the histograms may be analyzed, for example, by a SVM, wherein a distance is used to determine how similar the two data sets are. That is, the evaluating system 248 can analyze the first intermediate output and the second intermediate output, using the machine-trained model, to determine a difference between the first intermediate output and the second intermediate output, as block 508 recites.

The evaluating system 248 can compare each layer of the neural network or a sampling of the layers of the neural network. In at least one example, the pair of intermediate outputs can be selected by the evaluating system 248. In some examples, the evaluating system 248 can select representative layers (e.g., the last layer before an output or downsampling). In additional or alternative examples, the evaluating system 248 can select each layer of the neural network layers for comparison.

While reference is made above to using a machine-trained model, such as an SVM, to determine the difference, in additional or alternative examples, other machine-trained models can be used to determine the difference. For instance, other machine-trained models trained via k-means, clustering, embeddings in a neural network, etc. can be used to determine the difference.

Block 510 illustrates determining whether the difference meets or exceeds a threshold. Based at least in part on the difference not meeting or exceeding the threshold (e.g., indicating that the first intermediate output and the second intermediate output are similar), the system(s) described herein can utilize the simulated environment for training, testing, validation, etc., as illustrated in block 512. If the similarity metric (e.g., the difference) does not meet a threshold (e.g., the first intermediate output and the second intermediate output are similar), the evaluating system 248 can determine that the simulated environment activates a neural network similar to the real environment.

Based at least in part on the difference meeting or exceeding the threshold (e.g., indicating that the first intermediate output and the second intermediate output are not similar), the evaluating system 248 can tune one or more parameters, as illustrated in block 514. That is, if the similarity metric (e.g., the difference) meets or exceeds the threshold, the evaluating system 248 can tune one or more parameters to observe changes to the one or more metrics. For instance, the evaluating system 248 can tune parameters such as brightness, exposure, etc. for improving neural network activity associated with, e.g., using gradient descent, a machine learned model, or the like. When the similarity metric (e.g., the difference) is below the threshold (e.g., the first intermediate output and the second intermediate output are similar) or some other stopping criterion is reached, the evaluating system 248 can determine that the simulated environment and the real environment similarly activate the neural network. In at least one example, another stopping criterion can correspond to a change in difference (or other similarity metric) falling below a threshold.

In at least some examples, a similarity score output from the trained SVM (or otherwise) can be used as an input to another machine learning algorithm and/or optimization. Such an algorithm may incorporate the determined similarity metric as a loss function so that the model learns which parameters can be tuned to create simulated data (e.g., simulated images, LIDAR, RADAR, etc.) which causes activations in neural networks used in real data. The model and or optimization may be run until convergence. As above, various parameters which may be output from such an algorithm include, but are not limited to, a size of the grid used as input to the SVM, brightness, exposure, distance, Bayer filtering, number of histogram bins, a bireflectance distribution function (BRDF), noise, optical components and/or distortion, Schott noise, dark current, etc.

As described above, in some examples, simulated environments can be useful for enhancing training, testing, and/or validating systems (e.g., one or more components of an AI stack) onboard an autonomous vehicle. For instance, in at least one example, simulated environments can be useful for training systems that are to be used onboard an autonomous vehicle (e.g., models used by such systems), for instance when real data is not readily available, when testing would be unsafe in a real environment, and in order to generate magnitudes more data than would otherwise be available. In at least one example, simulated environments can be used for generating training data for rare or infrequently occurring scenarios and/or objects. Moreover, simulated environments can be useful for testing performance of an autonomous vehicle (e.g., models and/or systems running thereon), for instance when real environments are either not available or are not safe, or a ground truth is not otherwise available. Furthermore, in some examples, sensor data associated with simulated environments can be more accurate than sensor data associated real environments (e.g., due to occlusions, noise, drift, etc.) and as such, simulated environments can be used for validating observations made in association with real environments. In some examples, simulated environments can be used for calibration (e.g., of one or more sensor systems onboard an autonomous vehicle). Techniques described herein are directed to generating simulated environments and using simulated environments in various scenarios, as described above.

Techniques described herein are enable simulation systems to conserve resources by generating less photorealistic simulated environments than are required with conventional techniques, and instead simulation systems can direct resources to generating simulated environments that have enough detail to activate a neural network in a way that is substantially similar to a real environment. So long as a simulated environment activates a neural network in a way that is substantially similar to a real environment, a simulation system need not expend additional resources in generating photorealistic simulated environments. This conversation of resources can thus reduce compute required to generate simulated environments, and also enables the generation of such environments faster that what is available with conventional techniques.

EXAMPLE CLAUSES

A. A computer-implemented method comprising: receiving first data and second data associated with a real environment; inputting, as first input, at least a portion of the first data into an artificial neural network, the artificial neural network comprising a plurality of neural network layers; receiving, as a first intermediate output, a first plurality of activations associated with a selected layer of the artificial neural network; inputting, as second input, at least a portion of the second data into the artificial neural network; receiving, as a second intermediate output, a second plurality of activations from the selected layer; determining, based at least in part on the first intermediate output and the second intermediate output, a first similarity score; training a model based at least in part on the first similarity score; receiving third data and fourth data, the third data associated with the real environment and the fourth data associated with a corresponding simulated environment; inputting, as third input, at least a portion of the third data into the artificial neural network; receiving, as a third intermediate output, a third plurality of activations from another selected layer of the artificial neural network; inputting, as fourth input, at least a portion of the fourth data into the artificial neural network; receiving, as a fourth intermediate output, a fourth plurality of activations from the other selected layer; determining, based at least in part on the third intermediate output and the fourth intermediate output and the model, a second similarity score; and based at least in part on the second similarity score, modifying a parameter of the simulated environment to generate a modified simulated environment.

B. The computer-implemented method as paragraph A recites, wherein the first data, the second data, the third data, and the fourth data comprise image data, and the artificial neural network is associated with a detector.

C. The computer-implemented method as paragraph B recites, wherein the parameter is associated with at least one of brightness, exposure, reflectiveness, light source, or level of light.

D. The computer-implemented method as any of paragraphs A-C recite, further comprising: testing or validating an algorithm used onboard an autonomous vehicle using the modified simulated environment; and controlling the autonomous vehicle in the real environment based at least in part on the algorithm.

E. The computer-implemented method as any of paragraphs A-D recite, further comprising: determining that the second similarity score does not meet a threshold; and modifying the parameter based at least in part on determining that the second similarity score does not meet the threshold.

F. A system comprising: a processor; a computer-readable medium that, when executed by the processor, cause the processor to perform operations comprising: receiving first data associated with a real environment; receiving second data associated with a simulated environment; inputting, as first input, at least a portion of the first data into an artificial neural network, the artificial neural network comprising a plurality of neural network layers; receiving, as a first intermediate output, a first plurality of activations associated with a selected layer of the artificial neural network; inputting, as second input, at least a portion of the second data into the artificial neural network; receiving, as a second intermediate output, a second plurality of activations from the selected layer; determining, based at least in part on the first intermediate output and the second intermediate output, a first similarity score using a machine-trained model; and based at least in part on the first similarity score, modifying a parameter of the simulated environment to generate a modified simulated environment.

G. The system as any of paragraphs F-X recite, the operations further comprising: receiving third data and fourth data associated with the real environment; inputting, as third input, at least a portion of the third data into the artificial neural network; receiving, as a third intermediate output, a third plurality of activations from another selected layer of the artificial neural network; inputting, as fourth input, at least a portion of the fourth data into the artificial neural network; receiving, as a fourth intermediate output, a fourth plurality of activations from the other selected layer; determining, based at least in part on the third intermediate output and the fourth intermediate output, a second similarity score; and training the machine-trained model based at least in part on the second similarity score.

H. The system as paragraph G recites, wherein the third data and fourth data are associated with a same portion of the real environment.

I. The system as paragraph G recites, wherein the third data and fourth data are associated with a different portion of the real environment.

J. The system as paragraph G recites, wherein the third data and fourth data are associated with a similar portion of the real environment.

K. The system as paragraph G recites, wherein the machine-trained model is trained via a multi-class Support Vector Machine.

L. The system as any of paragraphs F-K recite, the operations further comprising: partitioning the first data into a first grid; partitioning the second data into the second grid; generating a first histogram of activations based at least in part on the first grid; generating a second histogram of activations based at least in part on the second grid; comparing, by the machine-trained model, the first histogram and the second histogram to generate the first similarity score.

M. The system as any of paragraphs F-L recite, the operations further comprising: testing or validating a model using the modified simulated environment; and controlling an autonomous vehicle in the real environment based at least in part on the model.

N. Computer-readable medium that, when executed by a processor, cause the processor to perform operations comprising: receiving first data associated with a real environment; receiving second data associated with a simulated environment; inputting, as first input, at least a portion of the first data into an artificial neural network, the artificial neural network comprising a plurality of neural network layers; receiving, as a first intermediate output, a first plurality of activations associated with a selected layer of the artificial neural network; inputting, as second input, at least a portion of the second data into the artificial neural network; receiving, as a second intermediate output, a second plurality of activations from the selected layer; determining, based at least in part on the first intermediate output and the second intermediate output, a first similarity score using a machine-trained model; and based at least in part on the first similarity score, modifying a parameter of the simulated environment to generate a modified simulated environment.

O. The computer-readable medium as paragraph N recites, the operations further comprising: receiving third data and fourth data associated with the real environment; inputting, as third input, at least a portion of the third data into the artificial neural network; receiving, as a third intermediate output, a third plurality of activations from another selected layer of the artificial neural network; inputting, as fourth input, at least a portion of the fourth data into the artificial neural network; receiving, as a fourth intermediate output, a fourth plurality of activations from the other selected layer; determining, based at least in part on the third intermediate output and the fourth intermediate output, a second similarity score; and training the machine-trained model based at least in part on the second similarity score.

P. The computer-readable medium as paragraph O recites, the operations further comprising wherein the third data and fourth data are associated with: a same portion of the real environment; a similar portion of the real environment; and a different portion of the real environment.

Q. The computer-readable medium as any of paragraphs N-P recite, wherein the machine-trained model is trained via a multi-class Support Vector Machine.

R. The computer-readable medium as any of paragraphs N-Q recite, the operations further comprising: discretizing the first data and the second data; generating a first histogram of activations based at least in part on the first data; generating a second histogram of activations based at least in part on the second data; comparing, using the machine-trained model, the first histogram and the second histogram to generate the first similarity score.

S. The computer-readable medium as any of paragraphs N-R recite, wherein the first data and the second data are image data or LIDAR data, wherein the machine-trained model is a first machine-trained model, and wherein modifying the parameter comprises: inputting the first similarity score into a second machine-trained model; and receiving, from the second machine-trained model, a revised set of parameters.

T. The computer-readable medium as any of paragraphs N-S recite, the operations further comprising: testing or validating a model using the modified simulated environment; and controlling an autonomous vehicle in the real environment based at least in part on the model.

While paragraphs A-E are described above with respect to a method, it is understood in the context of this document that the content of paragraphs A-E may also be implemented via a system, device, and/or computer storage media. While paragraphs F-M are described above with respect to a system, it is understood in the context of this document that the content of paragraphs F-M may also be implemented via a method, device, and/or computer storage media. While paragraphs N-T are described above with respect to a non-transitory computer-readable medium, it is understood in the context of this document that the content of paragraphs N-T may also be implemented via a method, device, and/or system.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein can be presented in a certain order, in some cases the ordering can be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A method comprising:
receiving first data associated with a real environment;
inputting the first data into a neural network comprising a neural network layer;
receiving, as a first output, a first activation associated with the neural network layer;
receiving second data associated with a simulated environment associated with the real environment;
inputting the second data into the neural network;
receiving, as a second output, a second activation associated with the neural network layer;
based at least in part on the first output and the second output, modifying a parameter associated with a sensor of the simulated environment to generate a modified simulated environment; and
controlling an autonomous vehicle in the real environment based at least in part on a model.

2. The method as claim 1 recites, wherein the first data comprises image data, the second data comprises simulated image data from the simulated environment, and the neural network is associated with a detector.

3. The method as claim 1 recites, wherein the parameter is associated with at least one of brightness, exposure, reflectiveness, light source, or level of light.

4. The method as claim 1 recites, further comprising:
determining, based at least in part on the first output and the second output, a similarity score; and
training the model based at least in part on the similarity score.

5. A system comprising:
one or more processors;
one or more non-transitory computer-readable media that, when executed by the one or more processors, cause the one or more processors to perform operations comprising:
receiving first data associated with a real environment;
receiving second data associated with a simulated environment;
inputting the first data into a neural network comprising a layer;
receiving, as a first output, a first activation associated with the layer;
inputting the second data into the neural network;
receiving, as a second output, a second activation associated with the layer;
determining, based at least in part on the first output and the second output, a similarity score representing a similarity between the simulated environment and the real environment;
based at least in part on the similarity score, modifying a parameter associated with a sensor of the simulated environment to generate a modified simulated environment; and
controlling an autonomous vehicle in the real environment based at least in part on a model.

6. The system as claim 5 recites, the operations further comprising:
receiving third data and fourth data associated with the real environment;
inputting the third data into the neural network;
receiving, as a third output, a third activation associated with an additional layer of the neural network;
inputting the fourth data into the neural network;
receiving, as a fourth output, a fourth activation associated with the additional layer;
determining, based at least in part on the third output and the fourth output, a second similarity score; and
training the model based at least in part on the second similarity score.

7. The system as claim 6 recites, wherein the third data and the fourth data are associated with a same portion of the real environment.

8. The system as claim 6 recites, wherein the third data and the fourth data are associated with a different portion of the real environment.

9. The system as claim 5 recites, the operations further comprising:
one or more of testing or validating an algorithm to be used onboard the autonomous vehicle using the modified simulated environment; and
transmitting the algorithm to the autonomous vehicle in the real environment based at least in part on the one or more of the testing or the validating.

10. The system as claim 6 recites, wherein:
the neural network comprises a first layer and a second layer different from the first layer,
the first activation is associated with the first layer,
the second activation is associated with the second layer, and
the similarity score represents a similarity between the first activation of the first layer and the second activation of the second layer.

11. The system as claim 5 recites, the operations further comprising:
associating the first data with a first discretized region;
associating the second data with a second discretized region;
determining a first histogram of activations based at least in part on the first discretized region;
determining a second histogram of activations based at least in part on the second discretized region; and
comparing the first histogram and the second histogram to determine the similarity score.

12. One or more non-transitory computer-readable media that, when executed by one or more processors, cause the one or more processors to perform operations comprising:
receiving first data associated with a real environment;

receiving second data associated with a simulated environment;

inputting the first data into a neural network comprising a first layer and a second layer;

receiving, as a first output, a first activation associated with the first layer;

inputting the second data into the neural network;

receiving, as a second output, a second activation associated with the second layer;

determining, based at least in part on the first output and the second output, a similarity score representing a similarity between the simulated environment and the real environment;

based at least in part on the similarity score, modifying a parameter associated with a sensor of the simulated environment to generate a modified simulated environment; and controlling an autonomous vehicle in the real environment based at least in part on a model.

13. The one or more non-transitory computer-readable media as claim 12 recites, the operations further comprising:
receiving third data and fourth data associated with the real environment;
inputting the third data into the neural network;
receiving, as a third output, a third activation associated with a third layer of the neural network;
inputting the fourth data into the neural network;
receiving, as a fourth output, a fourth activation associated with the third layer;
determining, based at least in part on the third output and the fourth output, a second similarity score; and
training the model based at least in part on the second similarity score.

14. The one or more non-transitory computer-readable media as claim 13 recites, wherein the third data and the fourth data are associated with:
a same portion of the real environment;
a similar portion of the real environment; and
a different portion of the real environment.

15. The one or more non-transitory computer-readable media as claim 12 recites, wherein the similarity score represents a similarity between the first activation of the first layer and the second activation of the second layer.

16. The one or more non-transitory computer-readable media as claim 12 recites, the operations further comprising:
discretizing the first data and the second data;
determining a first histogram of activations based at least in part on the first data;
determining a second histogram of activations based at least in part on the second data; and
comparing, using the model, the first histogram and the second histogram to determine the similarity score.

17. The one or more non-transitory computer-readable media as claim 12 recites, wherein the first data and the second data comprises image data or LIDAR data,
wherein the model is a first model, and
wherein modifying the parameter comprises:
inputting the similarity score into a second model; and
receiving, from the second model, a revised set of parameters.

18. The method as claim 1 recites, wherein the sensor comprises one of: a light detection and ranging sensor, a radio detection and ranging sensor, an ultrasonic transducer, a sound navigation and ranging sensor, a location sensor, an inertial sensor, an inertial measurement unit, an accelerometer, a magnetometer, a gyroscope, a camera, a wheel encoder, a microphone, an environment sensors, or a Time of Flight sensor.

19. The system as claim 5 recites, wherein the sensor comprises one of: a light detection and ranging sensor, a radio detection and ranging sensor, an ultrasonic transducer, a sound navigation and ranging sensor, a location sensor, an inertial sensor, an inertial measurement unit, an accelerometer, a magnetometer, a gyroscope, a camera, a wheel encoder, a microphone, an environment sensors, or a Time of Flight sensor.

20. The one or more non-transitory computer-readable media as claim 12 recites, wherein the sensor comprises one of: a light detection and ranging sensor, a radio detection and ranging sensor, an ultrasonic transducer, a sound navigation and ranging sensor, a location sensor, an inertial sensor, an inertial measurement unit, an accelerometer, a magnetometer, a gyroscope, a camera, a wheel encoder, a microphone, an environment sensors, or a Time of Flight sensor.

* * * * *